(12) United States Patent
Lee et al.

(10) Patent No.: US 8,921,912 B2
(45) Date of Patent: Dec. 30, 2014

(54) NONVOLATILE MEMORY DEVICE AND METHOD FOR FABRICATING THE SAME

(75) Inventors: Nam-Jae Lee, Gyeonggi-do (KR);
 Seiichi Aritome, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 204 days.

(21) Appl. No.: 13/402,989

(22) Filed: Feb. 23, 2012

(65) Prior Publication Data
 US 2012/0241840 A1 Sep. 27, 2012

(30) Foreign Application Priority Data

Mar. 22, 2011 (KR) ........................ 10-2011-0025261

(51) Int. Cl.
 *H01L 29/788* (2006.01)
 *H01L 29/66* (2006.01)
 *H01L 27/115* (2006.01)

(52) U.S. Cl.
 CPC ...... *H01L 27/11521* (2013.01); *H01L 29/7881* (2013.01); *H01L 29/66825* (2013.01)
 USPC .... 257/315; 257/319; 257/321; 257/E27.103; 257/E29.129

(58) Field of Classification Search
 CPC ................. H01L 27/11521; H01L 27/11524; H01L 27/11551; H01L 27/11519
 USPC ........... 257/319, 315, 321, E27.103, E29.129
 See application file for complete search history.

(56) References Cited

U.S. PATENT DOCUMENTS

2006/0249779 A1* 11/2006 Choi et al. .................... 257/315
2008/0303079 A1* 12/2008 Cho et al. ..................... 257/321

FOREIGN PATENT DOCUMENTS

| KR | 100707200 | 4/2007 |
| KR | 100875737 | 12/2008 |

OTHER PUBLICATIONS

Notice of Allowance issued by the Korean Intellectual Property Office on Oct. 29, 2012.

* cited by examiner

*Primary Examiner* — Minchul Yang
(74) *Attorney, Agent, or Firm* — IP & T Group LLP

(57) ABSTRACT

A nonvolatile memory device includes a substrate having active regions that are defined by an isolation layer and that have first sidewalls extending upward from the isolation layer, floating gates adjoining the first sidewalls of the active regions with a tunnel dielectric layer interposed between the active regions and the floating gates and extending upward from the substrate, an intergate dielectric layer disposed over the floating gates, and control gates disposed over the intergate dielectric layer.

10 Claims, 27 Drawing Sheets

NONVOLATILE MEMORY DEVICE AND METHOD FOR FABRICATING THE SAME

CROSS-REFERENCE TO RELATED APPLICATIONS

The present application claims priority of Korean Patent Application No. 10-2011-0025261, filed on Mar. 22, 2011, which is incorporated herein by reference in its entirety.

BACKGROUND

1. Field

Exemplary embodiments of the present invention relate to a nonvolatile memory device and a method for fabricating the same.

2. Description of the Related Art

A nonvolatile memory device is a memory device capable of storing data even though power supply is off. Various nonvolatile memory devices, for example, a NAND type flash memory, are widely used.

FIG. 1 is a cross-sectional view illustrating a conventional nonvolatile memory device.

Referring to FIG. 1, a substrate 10 with active regions 10A, which are defined by an isolation layer 11, is provided.

A tunnel dielectric layer 12 and floating gates 13 are disposed on the active regions 10A. The tunnel dielectric layer 12 and the floating gates 13 are formed in a stack structure over the respective active regions 10A when viewed in the transverse direction of the cross-section.

An intergate dielectric layer 14 is disposed on the resultant structure including the tunnel dielectric layer 12 and the floating gates 13. The intergate dielectric layer 14 is formed along the underlying profile.

Control gates 15 are disposed on the intergate dielectric layer 14 to extend in the transverse direction of the cross-section.

In the nonvolatile memory device configured as mentioned above, a program operation for storing charges in the floating gates 13 or an erase operation for removing the charges stored in the floating gates 13 is performed according to a voltage applied to the control gates 15.

As a semiconductor device is highly integrated, the width of the floating gates 13 or the gap between the floating gates 13 markedly decreases. Because the channel length L of a memory cell decreases as the width of the floating gates 13 decreases, leakage current increases, and securing a threshold voltage of a desired level is difficult upon performing the program operation. Also, as the gap between the floating gates 13 decreases, spaces for forming the control gates 15 become insufficient when the intergate dielectric layer 14 is formed between the floating gates 13 (see the reference symbol A).

SUMMARY

Embodiments of the present invention are directed to a nonvolatile memory device that can secure the channel width of a memory cell without increasing the width of a floating gate and can secure a space between floating gates, and a method for fabricating the same.

In accordance with an embodiment of the present invention, an nonvolatile memory device includes: a substrate having active regions that are defined by an isolation layer and that have first sidewalls extending upward from the isolation layer; floating gates adjoining the first sidewalls of the active regions with a tunnel dielectric layer interposed between the active regions and the floating gates and extending upward from the substrate; an intergate dielectric layer disposed over the floating gates; and control gates disposed over the intergate dielectric layer.

In accordance with another embodiment of the present invention, a method for fabricating a nonvolatile memory device includes: providing a substrate that defines active regions and isolation regions; forming an isolation layer in the isolation regions such that first sidewalls of the active regions extends upward from the isolation layer; forming floating gates that adjoin the first sidewalls of the active regions and extend upward from the substrate; forming a tunnel dielectric layer interposed between the floating gates and the active regions; forming an intergate dielectric layer over the floating gates; and forming control gates over the intergate dielectric layer.

DETAILED DESCRIPTION

Figure 1:
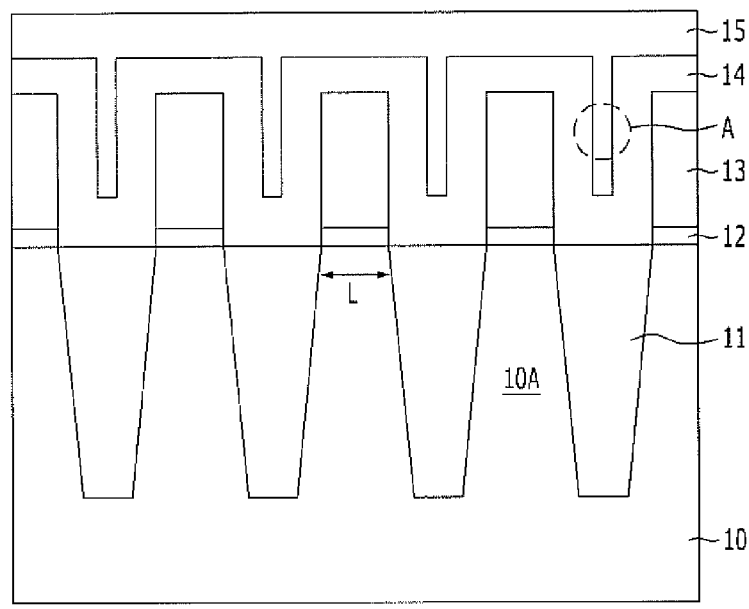
FIG. 1 is a cross-sectional view illustrating a conventional nonvolatile memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
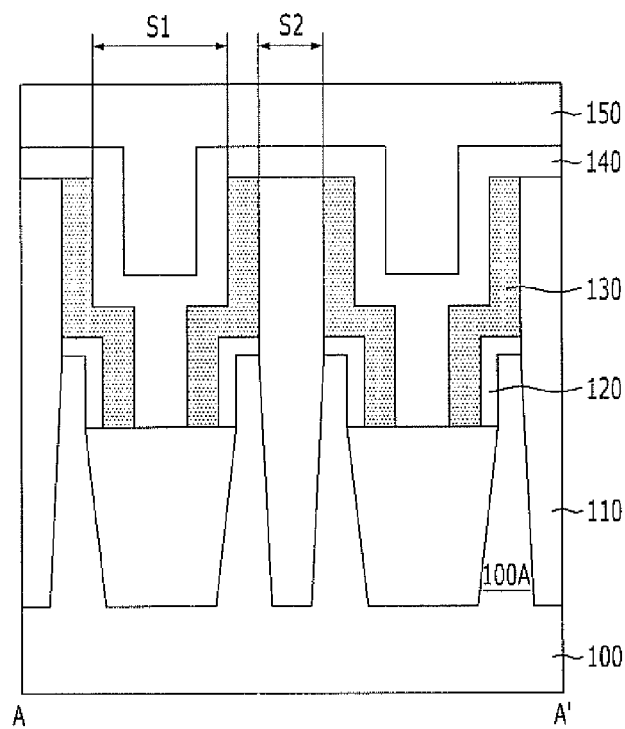
FIGS. 2A and 2B are a cross-sectional view and a plan view illustrating a nonvolatile memory device in accordance with a first embodiment of the present invention.
Figure 2B:
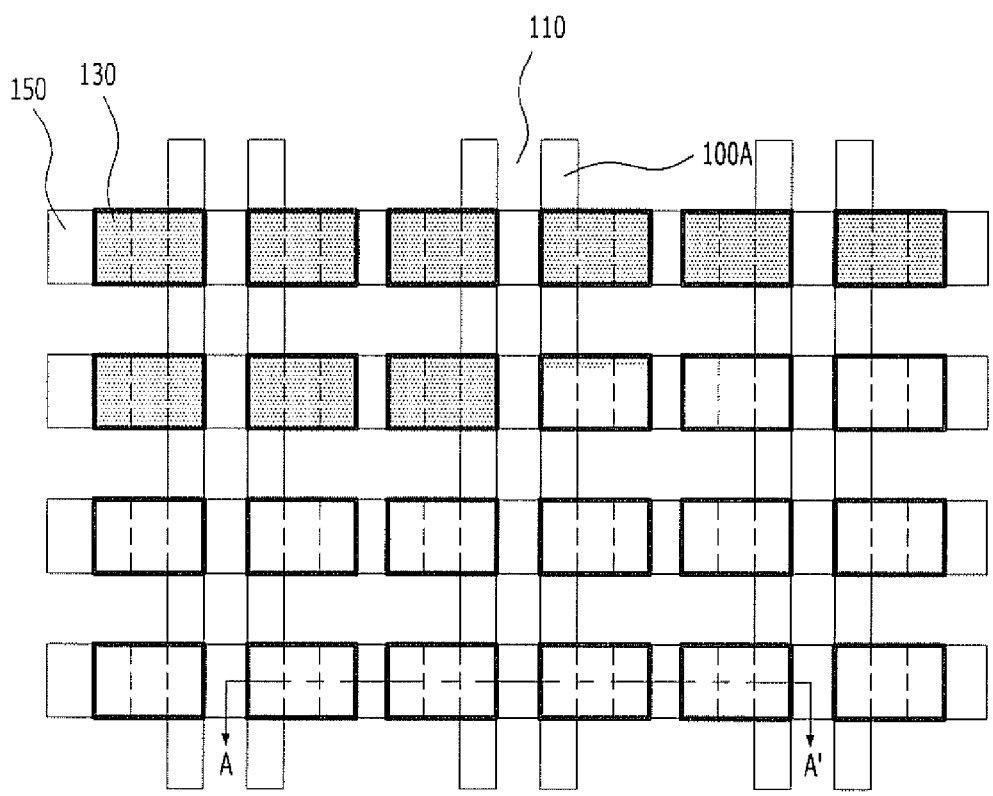

FIGS. 2A and 2B are a cross-sectional view and a plan view illustrating a nonvolatile memory device in accordance with a first embodiment of the present invention. In particular, FIG. 2A illustrates the cross-section taken along the line A-A' of FIG. 2B.

Referring to FIGS. 2A and 2B, a nonvolatile memory device in accordance with a first embodiment of the present invention includes a substrate 100 with active regions 100A, which are defined by an isolation layer 110, floating gates 130, which respectively adjoin one sidewalls of the active regions 100A with a tunnel dielectric layer 120 interposed therebetween and project out of the substrate 100, an intergate dielectric layer 140, which is disposed on the floating gates 130, and control gates 150, which are disposed on the intergate dielectric layer 140.

In detail, the plurality of active regions 100A of the substrate 100 extend in one direction and are arranged parallel to one another. For illustration purposes, the extending direction of the active regions 100A will be referred to as a first direction. The gap between the active regions 100A is not constant, and a narrow gap and a wide gap are alternately formed. Hereinafter, two active regions 100A, which are disposed adjacent to the narrow gap, will be referred to as a pair of active regions 100A. The wide gap is defined between the pair of active regions 100A and another pair of active regions 100A.

The sidewalls of the active regions 100A (hereinafter, referred to as first sidewalls of the active regions 100A), which at least adjoin the floating gates 130, extend vertically out of the isolation layer 110. Conversely, in the present embodiment, the sidewalls of the active regions 100A (hereinafter, referred to as second sidewalls of the active regions 100A), which do not adjoin the floating gates 130, do not extend out of the isolation layer 110. Rather, portions of the isolation layer 110, which adjoin the second sidewalls of the active regions 100A and are formed in the narrower gap, extend vertically out of the active regions 100A, and serve to support the floating gates 130.

The plurality of floating gates 130 are disposed below the control gates 150 and are arranged in a matrix type to be adjacent to the respective active regions 100A. In the present embodiment, each floating gate 130 may have a first portion that is disposed on the isolation layer 110 and adjoins the one sidewall of a corresponding active region 100A, a second portion that extends from the first portion and is bent toward the upper surface of the corresponding active region 100A, and a third portion that extends from the second portion and is disposed over the active region 100A. While it is illustrated in the present embodiment that the third portion adjoins the entire upper surface of the corresponding active region 100A, the present invention is not limited to such, and the third portion may adjoin a portion of the upper surface of the corresponding active region 100A. For illustration purposes, the sidewalls of the floating gates 130 that do not adjoin the active regions 100A will be referred to as first sidewalls of the floating gates 130, and the sidewalls of the floating gates 130 that adjoin the active regions 100A will be referred to as second sidewalls of the floating gates 130.

Since the active regions 100A and the floating gates 130 have the arrangements and shapes as described above, a space S1 between the first sidewall of a floating gate 130 and the first sidewall of another adjacent floating gate 130 has a relatively wide gap, and a space S2 between the second sidewall of a floating gate 130 and the second sidewall of another adjacent floating gate 130 has a relatively narrow gap. Accordingly, the space S1 provides sufficient space to form the integrate dielectric layer 140 and the control gate 150, as will be described later.

The intergate dielectric layer 140 is formed along the profile of the underlying structure including the floating gates 130, and has the same plane shape as the control gates 150. As described above, since the space S1 between the first sidewalls of the floating gates 130 is wide, the intergate dielectric layer 140 and the control gate 150 may be sufficiently formed in the space S1. In this regard, because the space S2 is narrower than the space S1, only the intergate dielectric layer 140 may be filled in the space S2, as shown in the drawing. The intergate dielectric layer 140 may be, for example, an ONO (oxide-nitride-oxide) layer.

The plurality of control gates 150 are disposed on the intergate dielectric layer 140 and extend parallel to one another in a second direction crossing with the first direction. The control gates 150 fills the spaces S1, and accordingly, the control gates 150 adjoin the first sidewalls of the floating gates 130 with the intergate dielectric layer 140 interposed therebetween and do not adjoin the second sidewalls of the floating gates 130. More specifically, in the present embodiment, it is intended that only the first sidewalls of the floating gates 130 are to be controlled by the control gates 150.

In the nonvolatile memory device in accordance with the first embodiment of the present invention, since the floating gates 130 adjoin the sidewalls of the active regions 100A, the channel width of a memory cell may be sufficiently secured by increasing the height of the sidewalls of the active regions 100A adjoining the floating gates 130, regardless of the length of the floating gates 130. Furthermore, because only the first sidewalls of the floating gates 130 adjoin the intergate dielectric layer 140 and the control gates 150, a space for forming the intergate dielectric layer 140 and the control gates 150 may be sufficiently secured.

Figure 2C:
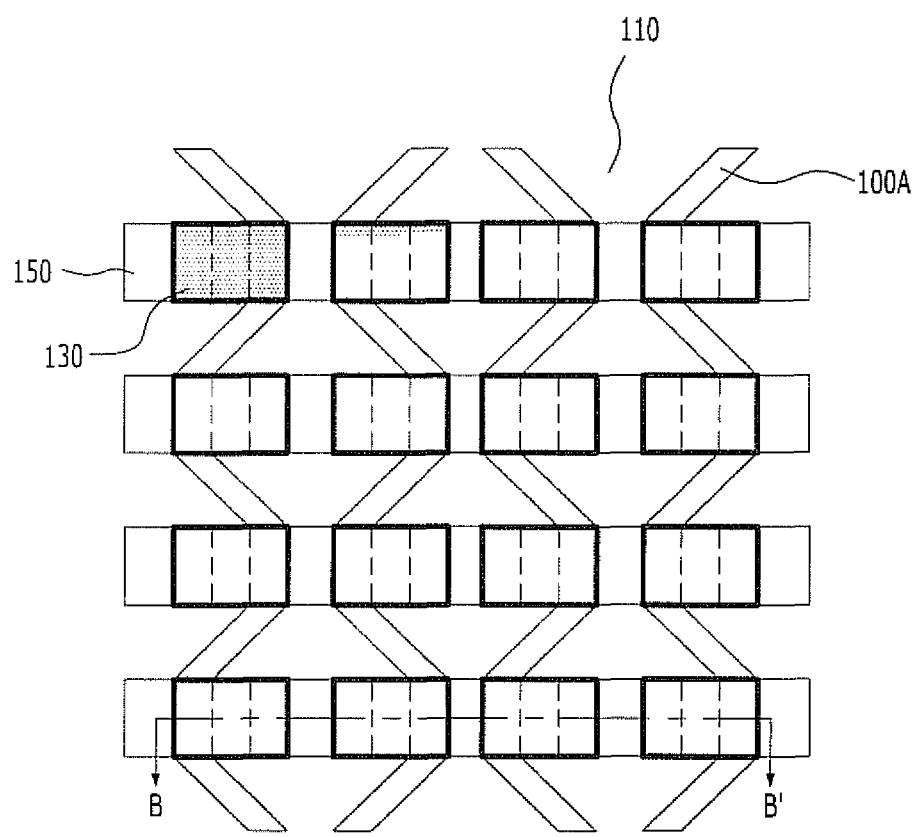
FIG. 2C is a plan view illustrating a nonvolatile memory device in accordance with a variation of the first embodiment of the present invention.
Figure 2D:
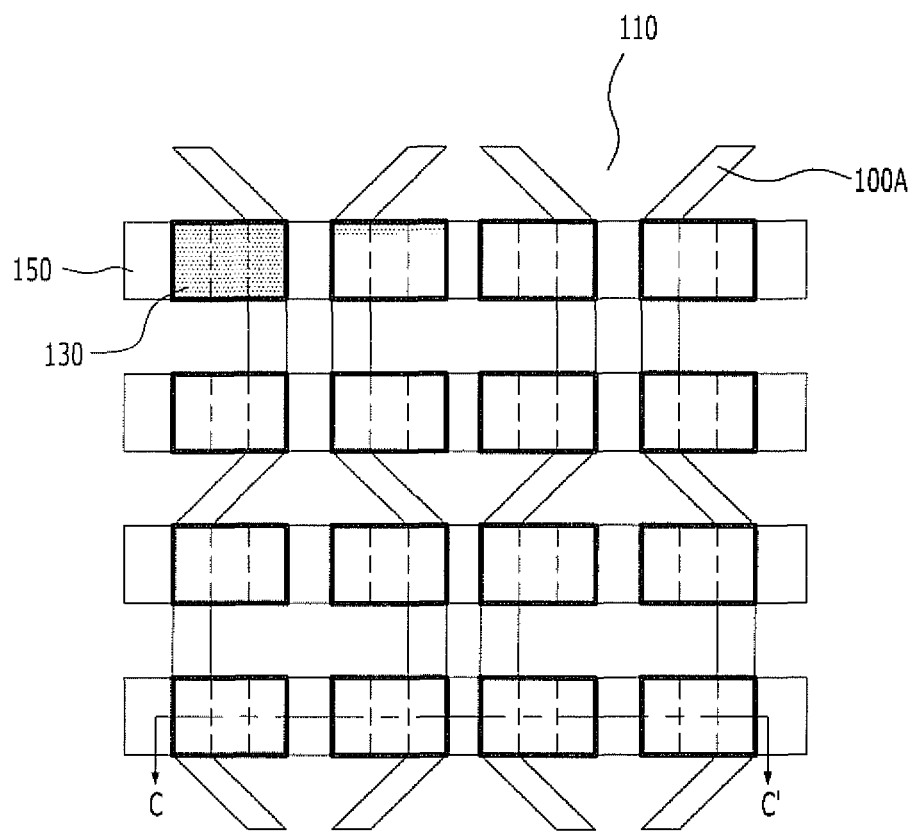
FIG. 2D is a plan view illustrating a nonvolatile memory device in accordance with another variation of the first embodiment of the present invention.

The plane shape of the nonvolatile memory device in accordance with the first embodiment may be varied as shown in FIGS. 2C and 2D while having the same characteristic features as those of the first embodiment.

FIG. 2C is a plan view illustrating a nonvolatile memory device in accordance with a variation of the first embodiment of the present invention. FIG. 2A described above illustrates the cross-section taken along the line B-B' of FIG. 2C. FIG. 2D is a plan view illustrating a nonvolatile memory device in accordance with another variation of the first embodiment of the present invention. FIG. 2A described above illustrates the cross-section taken along the line C-C' of FIG. 2D. Only differences from FIG. 2B will be described.

In FIG. 2B, one active region 100A has a linear shape which extends in the first direction, and accordingly, the sidewalls of the floating gates 130, which adjoin the first sidewall of the active region 100A, are placed on one straight line that extends in the first direction.

Referring to FIG. 2C, among the sidewalls of the floating gates 130 that adjoin one active region 100A, for example, the sidewalls of floating gates 130 that are disposed under odd-numbered control gates 150 are positioned on one straight line which extends in the first direction, and the sidewalls of floating gates 130 that are disposed under even-numbered control gates 150 are positioned on another straight line which extends in the first direction. To this end, each active region 100A has a zigzag shape that substantially extends in the first direction to adjoin first sidewalls of the floating gates 130, which are disposed under the odd-numbered control gates 150, and adjoin second sidewalls of the floating gates 130, which are disposed under the even-numbered control gates 150. In this variation, coupling among the floating gates 130 in the first direction may be reduced.

Referring to FIG. 2D, among the sidewalls of the floating gates 130 that adjoin one active region 100A, for example, the sidewalls of floating gates 130 that are disposed under an odd-numbered pair of control gates 150 are positioned on one straight line which extends in the first direction, and the sidewalls of floating gates 130 that are disposed under an even-numbered pair of control gates 150 are positioned on another straight line that extends in the first direction. To this end, each active region 100A has a zigzag shape that substantially extends in the first direction to adjoin first sidewalls of the floating gates 130 that are disposed under the odd-numbered pair of control gates 150, and adjoin second sidewalls of the floating gates 130 that are disposed under the even-numbered pair of control gates 150. In this variation, coupling among the floating gates 130 in the first direction may be reduced, and the nonvolatile memory device may be realized more easily.

Even in the variations of FIGS. 2C and 2D, similar to FIG. 2B, the sidewalls of the active regions 100A that adjoin the floating gates 130, may be referred to as first sidewalls of the active regions 100A, and the sidewalls of the active regions 100A that do not adjoin the floating gates 130 may be referred to as second sidewalls of the active regions 100A. The sidewalls of the floating gates 130 that do not adjoin the active regions 100A may be referred to as first sidewalls of the floating gates 130, and the sidewalls of the floating gates 130 that adjoin the active regions 100A may be referred to as second sidewalls of the floating gates 130. In this regard, the descriptions given above with reference to FIGS. 2A and 2B may be applied to FIGS. 2C and 2D.

FIGS. 3A to 3H are cross-sectional views illustrating an embodiment of a method for fabricating the nonvolatile memory device in accordance with the first embodiment of the present invention. These cross-sectional views illustrate cross-sections taken along the line A-A' of FIG. 2B. These cross-sectional views may be used to describe a method for fabricating a nonvolatile memory device in accordance with the variation of the first embodiment or another variation of the first embodiment.

Figure 3A:
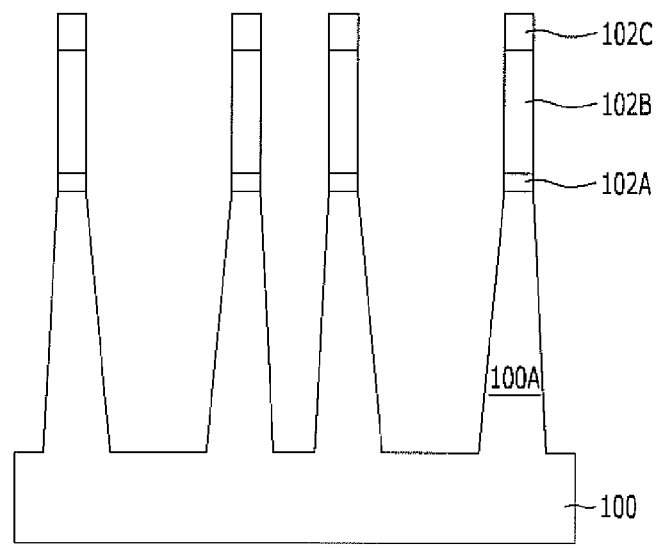
FIGS. 3A to 3H are cross-sectional views illustrating an embodiment of a method for fabricating the nonvolatile memory device in accordance with the first embodiment of the present invention.

Referring to FIG. 3A, after forming a stack structure of a first tunnel dielectric layer 102A and first and second hard mask patterns 102B and 102C on a substrate 100 to expose isolation regions, the substrate 100 is etched to a designated depth using the stack structure to form trenches and active regions 100A, which are defined by the trenches. A narrow gap and a wide gap may be alternately and repeatedly defined between the active regions 100A. More specifically, isolation regions with a narrow gap and isolation regions with a wide gap may be alternately and repeatedly defined between active regions 100A.

The first tunnel dielectric layer 102A may include an oxide layer, the first hard mask patterns 102B may include a nitride layer, and the second hard mask patterns 102C may include an oxide layer.

Figure 3B:
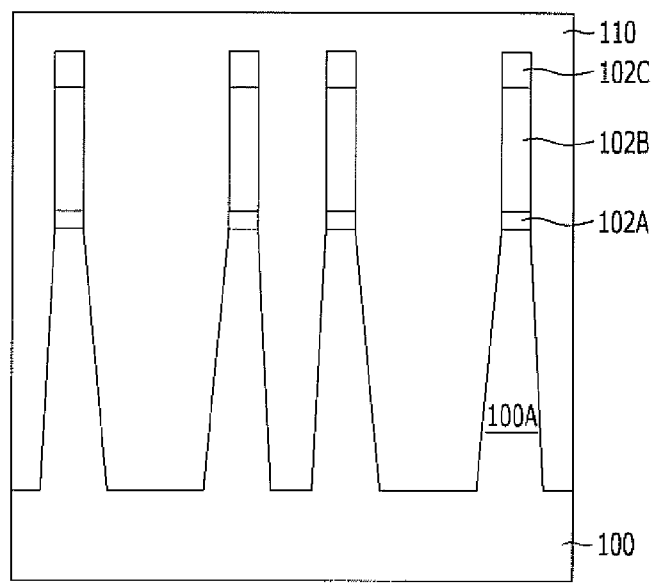

Referring to FIG. 3B, an isolation layer 110 is formed to cover the entire resultant structure of FIG. 3A. The isolation layer 110 may include, for example, an oxide layer.

Figure 3C:
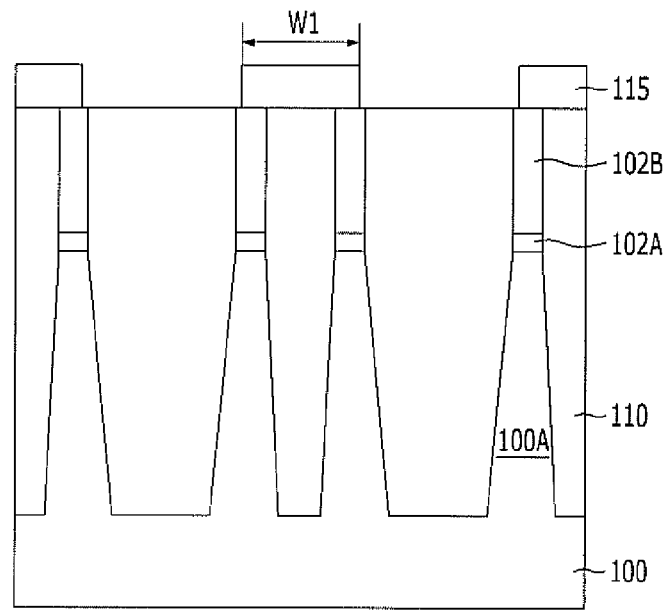

Referring to FIG. 3C, a planarization process is performed until the first hard mask patterns 102B are exposed. The planarization process may be performed, for example, through CMP (chemical mechanical polishing).

Then, mask patterns 115 are formed on the resultant structure having undergone the planarization process. In detail, each mask pattern 115 is formed to cover at least the isolation region with the narrow gap and at most the isolation region with the narrow gap and active regions 100A on both sides of the isolation region with the narrow gap. Namely, a width W1 of each mask pattern 115 in the second direction may have a value equal to or greater than the width of the isolation region with the narrow gap in the second direction and equal to or less than the summed width of the isolation region with the narrow gap and the active regions 100A on both sides of the isolation region with the narrow gap in the second direction.

Figure 3D:
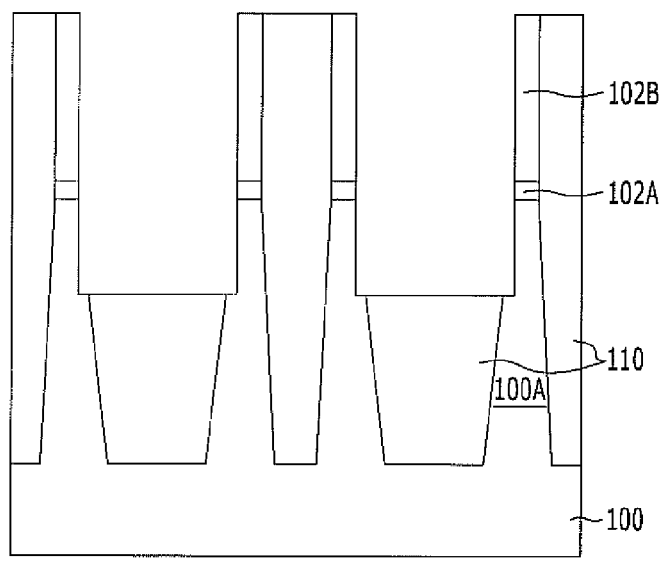

Referring to FIG. 3D, the isolation layer 110, the active regions 100A, the first tunnel dielectric layer 102A, and the first hard mask patterns 102B that are exposed by the mask patterns 115 are etched by a designated depth using the mask patterns 115 as an etch mask. The etching is performed in so that the height of the isolation layer 110 that is exposed by the mask patterns 115 is lower than the height of the active regions 100A by a designated level.

As a result of such etching, the height of the isolation layer 110 that is disposed in the isolation regions with the wide gap becomes lower than the height of the active region 100A. Also, first sidewalk of the active regions 100A extend vertically out of the isolation layer 110. The first sidewalls of the active regions 100A adjoin floating gates, as will be described later.

Figure 3E:
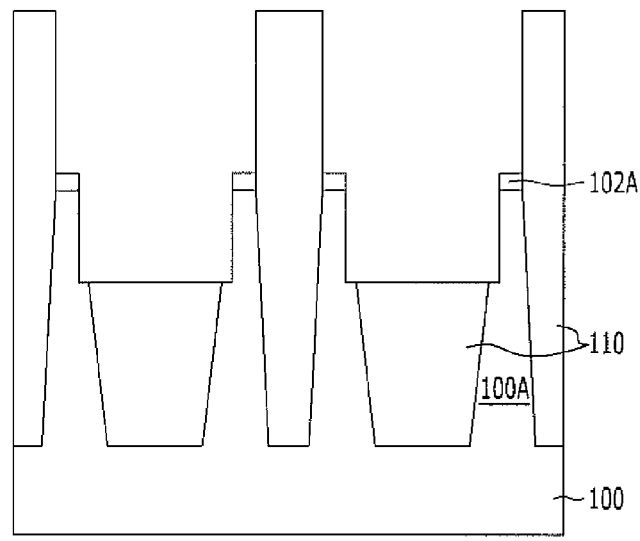

Referring to FIG. 3E, the first hard mask patterns 102B are to removed.

If the first tunnel dielectric layer 102A and the isolation layer 110 include oxide layers and the first hard mask patterns 102B include a nitride layer as described above, the first hard mask patterns 102B may be removed, for example, through a nitride strip process using a phosphoric acid solution.

Figure 3F:
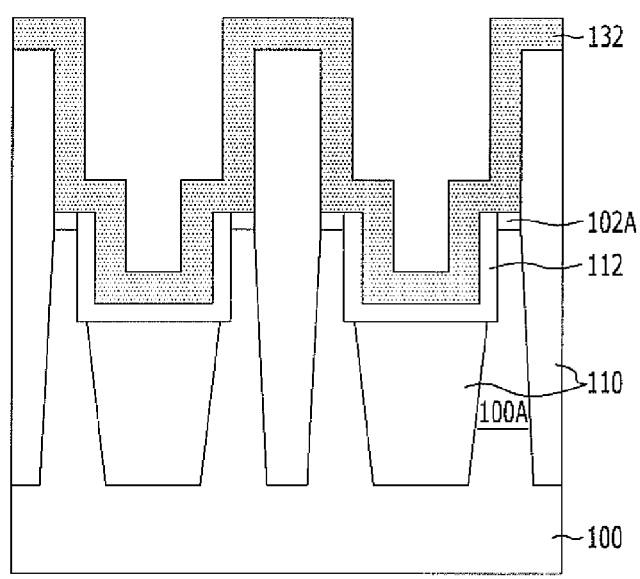

Referring to FIG. 3F, a second tunnel dielectric layer 112 is formed at least on the first sidewalls of the active regions 100A that are exposed. While it is illustrated in the drawing that the second tunnel dielectric layer 112 is formed even on the sidewalls of the first tunnel dielectric layer 102A and on the isolation layer 110, the present invention is not limited to such, and it is sufficient that the second tunnel dielectric layer 112 is disposed on the first sidewalls of the active regions 100A that are exposed. Such formation of the second tunnel dielectric layer 112 may be implemented through a deposition process or an oxidation process. The second tunnel dielectric layer 112 may include an oxide layer.

As a result, the second tunnel dielectric layer 112 and the first tunnel dielectric layer 102A are respectively disposed on the first sidewalls and the upper surfaces of the active regions 100A and may perform substantially the same function as the tunnel dielectric layer 120 shown in FIG. 2A.

Subsequently, a conductive layer 132 for floating gates is formed along the profile of the resultant structure including the second tunnel dielectric layer 112 and the active regions 100A. The conductive layer 132 for forming floating gates may include, for example, a polysilicon layer.

Figure 3G:
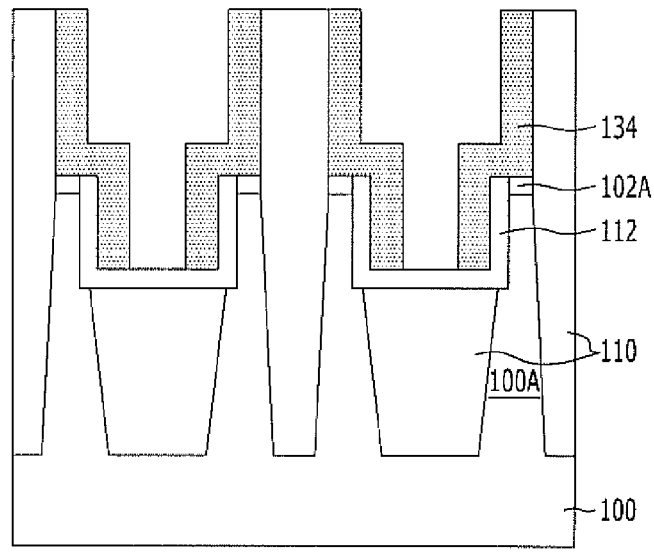

Referring to FIG. 3G, by performing blanket etching for the conductive layer 132, the conductive layer 132 is divided into two floating gates (designated by the reference numeral 134) corresponding with the pair of active regions 100A around the wide gap.

The conductive layer 134 adjoins the first sidewalls and the upper surfaces of the active regions 100A with the second tunnel dielectric layer 112 and the first tunnel dielectric layer 102A interposed therebetween, and projects out of the substrate 100. The divided conductive layer 134 is supported by the isolation layer 110 that is disposed in the isolation regions with the narrow gap.

Figure 3H:
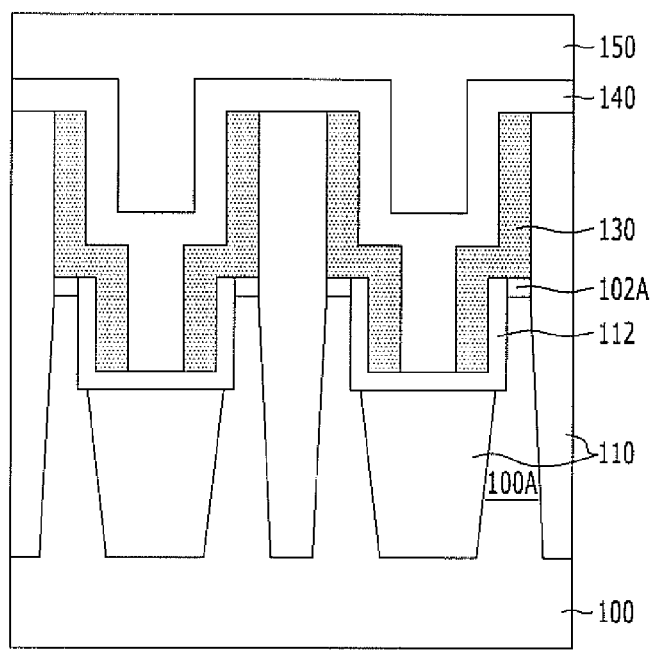

Referring to FIG. 3H, an intergate dielectric layer 140 is formed along the profile of the resultant structure including the conductive layer 134. Since the spaces between portions of first sidewalls of the conductive layer 134 that do not project out of the substrate 100 are relatively narrow, they are completely filled by the intergate dielectric layer 140. Conversely, since the spaces between portions of the first sidewalls of the conductive layer 134 that extend out of the substrate 100 are relatively wide, they are not completely filled by the intergate dielectric layer 140. The intergate dielectric layer 140 may be formed by sequentially depositing an oxide layer, a nitride layer and an oxide layer.

Subsequently, by depositing a conductive layer for control gates on the intergate dielectric layer 140 and patterning the conductive layer, the intergate dielectric layer 140 and the conductive layer 134 for floating gates, control gates 150, which extend in the second direction, the intergate dielectric layer 140, which is disposed under the control gates 150 and extends in the second direction, and floating gates 130, which are disposed below the control gates 150, are formed and divided in the second direction for the respective active regions 100A. As described above, since the spaces between the portions of the first sidewalls of the conductive layer 134 for floating gates that project out of the substrate 100, are relatively wide, the conductive layer for control gates may be filled in these spaces.

FIGS. 4A to 4H are cross-sectional views illustrating another embodiment of a method for fabricating the nonvolatile memory device in accordance with the first embodiment of the present invention. These cross-sectional views illustrate cross-sections taken along the line A-A' of FIG. 2B. These cross-sectional views may be used to describe a method for fabricating a nonvolatile memory device in accordance with the variation of the first embodiment or another variation of the first embodiment. The differences from the processes described above with reference to FIGS. 3A to 3H will be mainly described.

Figure 4A:
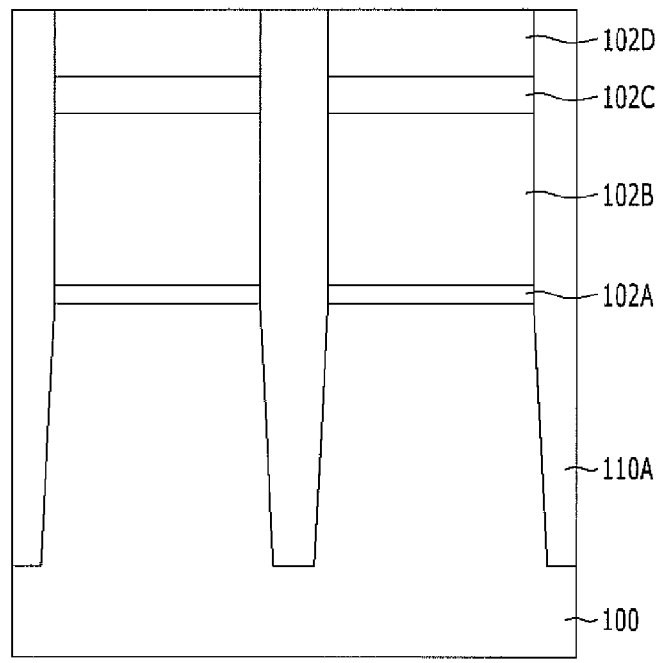
FIGS. 4A to 4H are cross-sectional views illustrating another embodiment of a method for fabricating the nonvolatile memory device in accordance with the first embodiment of the present invention.

Referring to FIG. 4A, a stack structure is formed where a first tunnel dielectric layer 102A and first to third hard mask patterns 102B, 102C and 102D are sequentially stacked on a substrate 100. The layers are stacked to expose isolation regions with a narrow gap. The substrate 100 is etched to a designated depth using the stack structure as an etch mask to form trenches in the isolation regions with the narrow gap.

As described above, the first tunnel dielectric layer 102A may include an oxide layer, the first hard mask patterns 102B may include a nitride layer and the second hard mask patterns 102C may include an oxide layer, and the third hard mask patterns 102D may include a nitride layer.

Subsequently, by forming a dielectric layer, for example, an oxide layer, to cover the entire resultant structure including the trenches and performing a planarization process, for example, CMP, to expose the third hard mask patterns 102D, a first isolation layer 110A is formed in the isolation regions with the narrow gap.

Figure 4B:
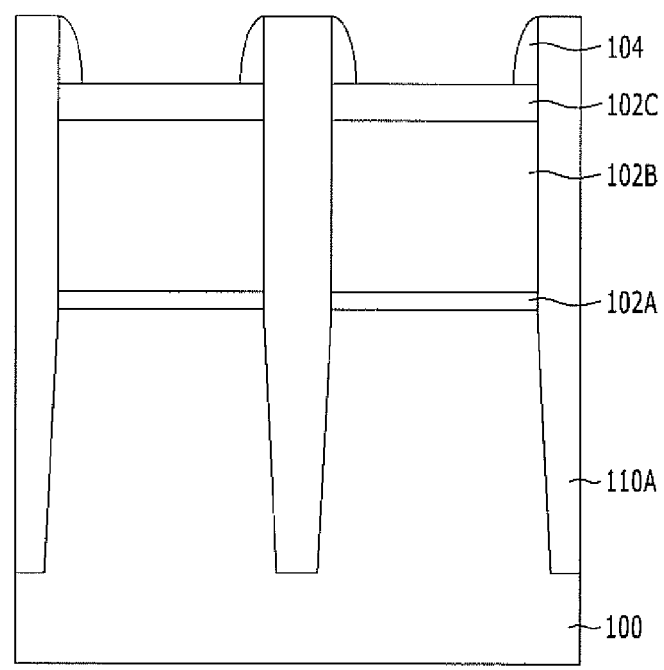

Referring to FIG. 4B, after removing the third hard mask patterns 102D, spacers 104 are formed on both sidewalls of the first isolation layer 110A above the second hard mask patterns 102C. The spacers 104 are formed by depositing a dielectric layer, for example, a nitride layer, on the entire surface of the resultant structure including the stacked structure without the third hard mask layer 102D and the first isolation layer 110A. A blanket etch is subsequently performed to form the spacers 104.

Figure 4C:
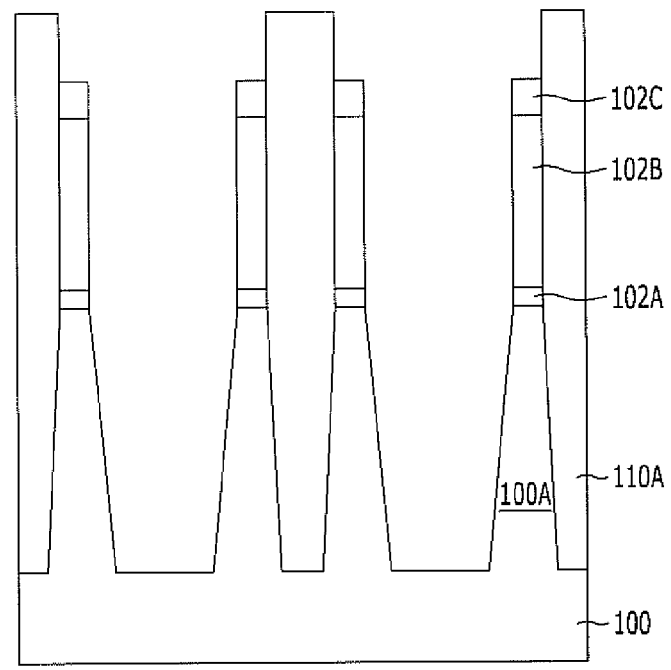

Referring to FIG. 4C, the stack structure of the first tunnel dielectric layer 102A, the first hard mask patterns 10213 and the second hard mask patterns 102C and the underlying substrate 100 is etched using the spacers 104 and the first dielectric layer 110A as an etch mask to form trenches that define isolation regions with a wide gap.

As a result of this process, active regions 100A are formed that are defined by the isolation regions with the narrow gap and the isolation regions with the wide gap.

After the etching process, the spacers 104 are removed.

Figure 4D:
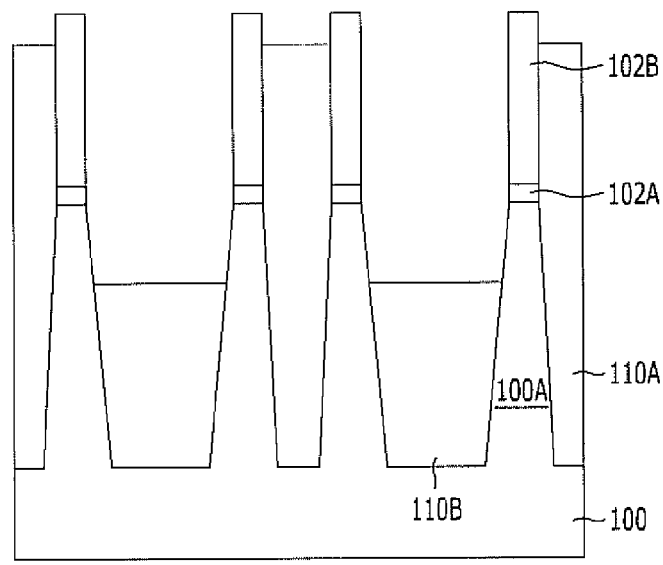

Referring to FIG. 4D, after forming a dielectric layer, for example, an oxide layer, to cover the resultant structure of FIG. 4C, a polishing process such as CMP or an etch-back process is performed for the dielectric layer such that the height of the dielectric layer filled in the isolation regions with the wide gap is lower than the height of the active regions 100A by a designated level. At this time, the first isolation layer 110A, which is disposed in the isolation regions with the narrow gap, is not substantially removed and remain in the isolation region with a narrow gap. is the first isolation layer 110A remains because a polishing speed or an etching speed in a narrow space is lower than a polishing speed or an etching speed in a wide space.

As a result of this process, a second isolation layer 1108, which is disposed in the isolation regions with the wide gap and has a height lower than that of the active regions 100A, is formed. By such forming of the second isolation layer 1108, first sidewalls of the active regions 100A vertically extend above of the second isolation layer 110B.

Figure 4E:
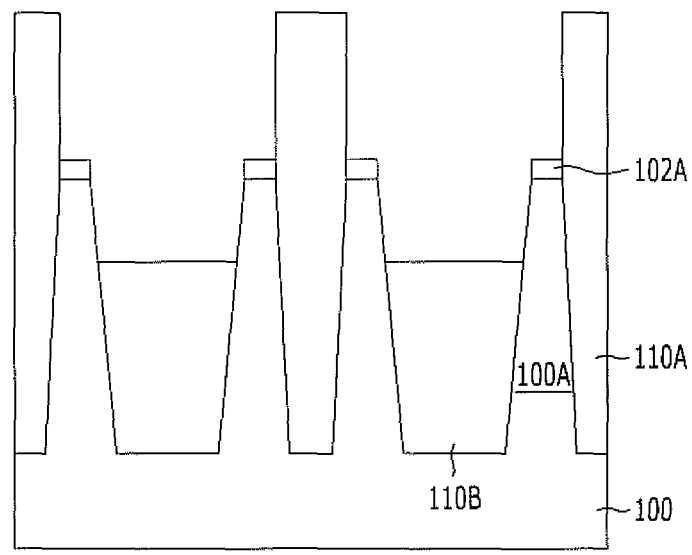

Referring to FIG. 4E, the first hard mask patterns 102B are removed.

Figure 4F:
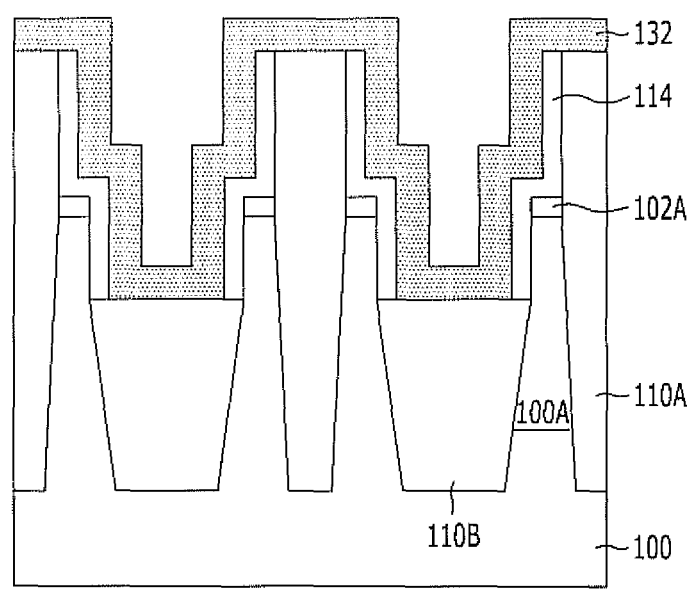

Referring to FIG. 4F, a second tunnel dielectric layer 114 is formed at least on portions of the active regions 100A that are exposed. While it is illustrated in the drawing that the second tunnel dielectric layer 114 is formed even on the sidewalls and the upper surfaces of the first tunnel dielectric layer 102A and on the sidewalls of the first isolation layer 102A, the present invention is not limited to such, and it is sufficient that the second tunnel dielectric layer 114 is disposed on the first sidewalls of the active regions 100A that are exposed. The second tunnel dielectric layer 114 may be formed so that that a dielectric layer for forming the second tunnel dielectric layer 114 is deposited on the entire surface of the resultant structure including the active regions 100A and the first and second isolation layers 110A and 110B and blanket etching is performed for the dielectric layer. The second tunnel dielectric layer 114 and the first tunnel dielectric layer 102A may perform substantially the same function as the tunnel dielectric layer 120 shown in FIG. 2A.

Next, a conductive layer 132 for floating gates is formed along the profile of the underlying resultant structure formed with the second tunnel dielectric layer 114.

Figure 4G:
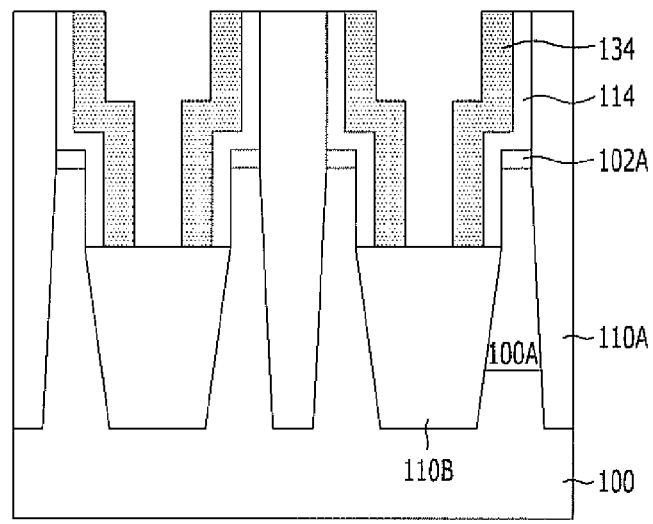
Figure 4H:
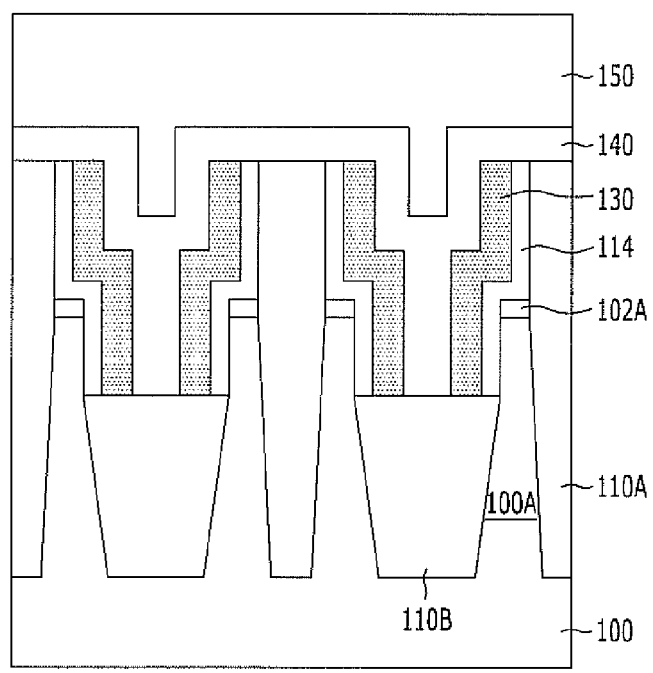

Subsequent processes shown in FIGS. 4G and 4H are substantially the same as those shown in FIGS. 3G and 3H.

More specifically, referring to FIG. 4G, by performing blanket etching for the conductive layer 132 for floating gates, a conductive layer 134 for floating gates, which is divided in the second direction for the respective active regions 100A, is formed.

Referring to FIG. 4H, an intergate dielectric layer 140 is formed along the profile of the resultant structure including the conductive layer 134 for floating gates, and a conductive layer for control gates is formed on the intergate dielectric layer 140. Subsequently, by patterning the conductive layer for control gates, the intergate dielectric layer 140, and the conductive layer 134 for floating gates, control gates 150, which extend in the second direction, the intergate dielectric layer 140, which is disposed under the control gates 150 and extends in the second direction, and floating gates 130, which are disposed below the control gates 150, are formed.

Figure 5A:
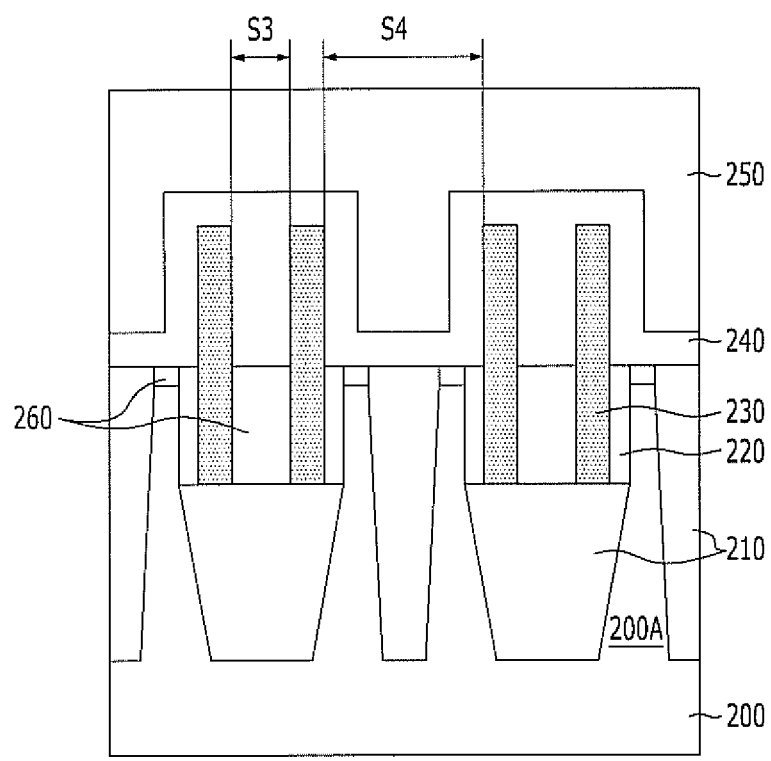
FIGS. 5A and 5B are a cross-sectional view and a plan view illustrating a nonvolatile memory device in accordance with a second embodiment of the present invention.
Figure 5B:
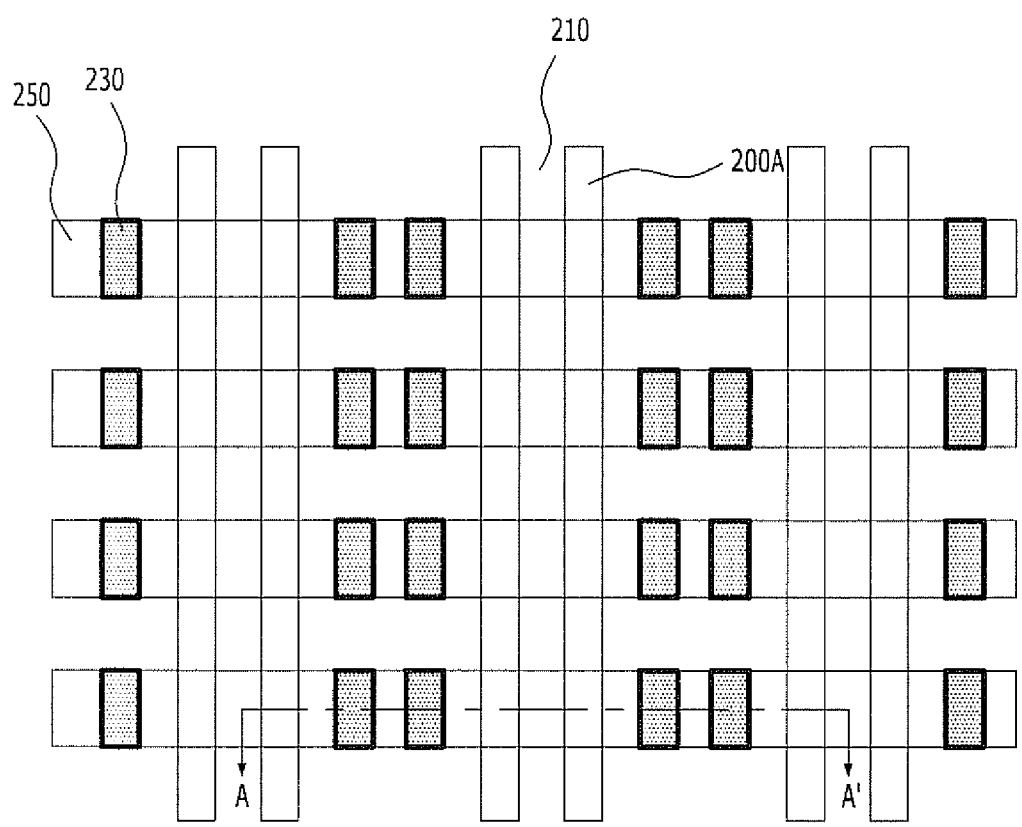

FIGS. 5A and 5B are a cross-sectional view and a plan view illustrating a nonvolatile memory device in accordance with a second embodiment of the present invention. In particular, FIG. 5A illustrates the cross-section taken along the line A-A' of FIG. 5B. When comparing the nonvolatile memory device in accordance with the second embodiment with that of the first embodiment, the nonvolatile memory device in accordance with the second embodiment is similar to that of the first embodiment except that the shape of a floating gate is different and accordingly, the sidewall of the floating gate, which adjoins a control gate, is different. The differences with respect to the first embodiment will be mainly described.

Referring to FIGS. 5A and 5B, active regions 200A defined in a substrate 200 by an isolation layer 210 have substantially the same plane shape as described above with reference to FIG. 2B. At least first sidewalls of the active regions 200A, which adjoin floating gates 230, extend vertically upward out of the isolation layer 210. Conversely, in the present embodiment, the second sidewalls of the active regions 200A, which do not adjoin the floating gates 230, do not extend out of the isolation layer 210.

The floating gates 230 adjoin the first sidewalls of the active regions 200A with a tunnel dielectric layer 220 interposed between the active regions 200A and the floating games 230 and extend out of the substrate 200. The floating gates 230 have substantially rectangular sectional shapes, and the floating gates 230 of the present embodiment are differentiated from the floating gates 130 of the first embodiment, which have shapes bent toward the upper surfaces of the active regions 100A. More specifically, the floating gates 230 adjoin only the first sidewalk of the active regions 200A with the tunnel dielectric layer 220 interposed therebetween and do not adjoin the upper surfaces of the active regions 200A.

When assuming that the sidewalk of the floating gates 230 that do not adjoin the active regions 200A are first sidewalls, and the sidewalls of the floating gates 230 that adjoin the active regions 200A are the second sidewalls, unlike the first embodiment, a space S3 between the first sidewall of a floating gate 230 and the first sidewall of another adjacent floating gate 230 has a relatively narrow gap, and a space S4 between the second sidewall of a floating gate 230 and the second sidewall of another adjacent floating gate 230 has a relatively wide gap. Accordingly, an intergate dielectric layer 240 and a control gate 250 may be sufficiently formed in the space S4 between the second sidewalls of the two adjacent floating gates 230, as will be described later.

The intergate dielectric layer 240 is formed along the profile of the underlying structure including the floating gates 230. Since the space S4 between the second sidewalls of the floating gates 230 is wide, the intergate dielectric layer 240 and the control gate 250 may be sufficiently formed in the space S4. Conversely, the space S3 between the first sidewalls of the floating gates 230 is relatively narrow, and therefore, the space S3 may be completely filled with the intergate dielectric layer 240.

A plurality of control gates 250 are disposed on the intergate dielectric layer 240, extend in a second direction crossing with the first direction, and are arranged parallel to one another. The control gates 250 have portions that fill spaces S4, and accordingly, the control gates 250 adjoin the second sidewalls of the floating gates 230 with the intergate dielectric layer 240 interposed between the control gates 250 and the floating gates 230 and do not adjoin the first sidewalls of the floating gates 230. More specifically, in the present embodiment, only the second sidewalls of the floating gates 230 are used to be controlled by the control gates 250.

A dielectric layer 260, for example, an oxide layer, may remain after processes for fabricating the nonvolatile memory device according to the present embodiment, as will be described later.

Figure 5C:
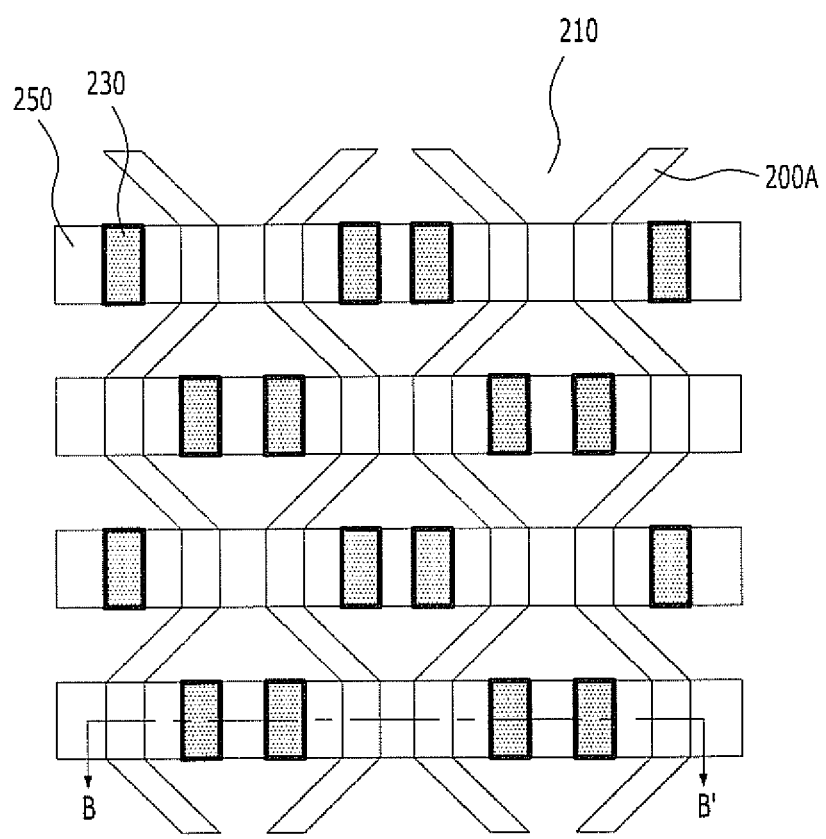
FIG. 5C is a plan view illustrating a nonvolatile memory device in accordance with a variation of the second embodiment of the present invention.
Figure 5D:
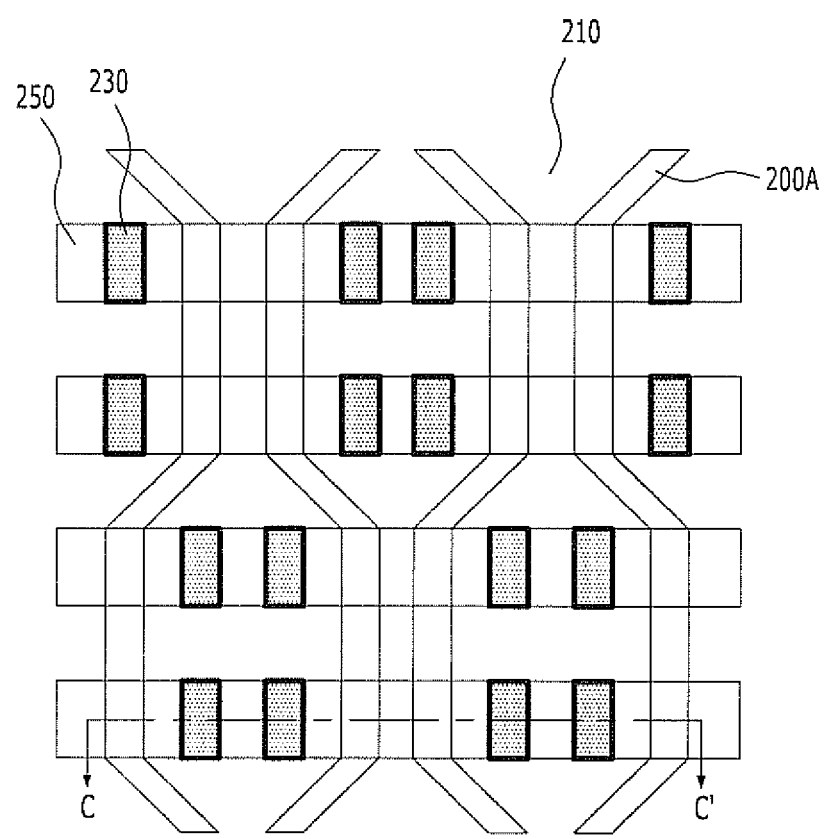
FIG. 5D is a plan view illustrating a nonvolatile memory device in accordance with another variation of the second embodiment of the present invention.

Meanwhile, the plane shape of the nonvolatile memory device in accordance with the second embodiment may be varied, as shown in FIGS. 5C and 5D, while having the same characteristic features as those of the second embodiment.

FIG. 5C is a plan view illustrating a nonvolatile memory device in accordance with a variation of the second embodiment of the present invention. FIG. 5A described above illustrates the cross-section taken along the line B-B' of FIG. 5C. FIG. 5D is a plan view illustrating a nonvolatile memory device in accordance with another variation of the second embodiment of the present invention. FIG. 5A described above illustrates the cross-section taken along the line C-C' of FIG. 5D. Detailed descriptions for these nonvolatile memory devices will be omitted since they are the same as those given above with reference to FIGS. 2C and 2D.

FIGS. 6A to 6H are cross-sectional views illustrating an embodiment of a method for fabricating the nonvolatile memory device in accordance with the second embodiment of the present invention. These cross-sectional views illustrate cross-sections taken along the line A-A' of FIG. 5B. These cross-sectional views may be used to describe a method for fabricating a nonvolatile memory device in accordance with the variation of the second embodiment or another variation of the second embodiment.

Figure 6A:
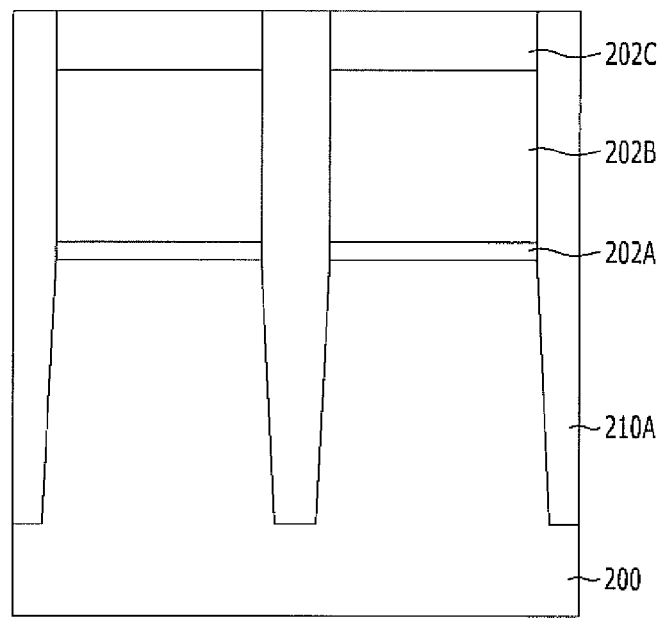
FIGS. 6A to 6H are cross-sectional views illustrating an embodiment of a method for fabricating the nonvolatile memory device in accordance with the second embodiment of the present invention.

Referring to FIG. 6A, a stack structure including a first tunnel dielectric layer 202A and first and second hard mask patterns 202B and 202C are formed on a substrate 200 to expose isolation regions with a narrow gap. Subsequently, the substrate 200 is etched to a designated depth using the stack structure as an etch mask to form trenches in the isolation regions with the narrow gap.

The first tunnel dielectric layer 202A may include an oxide layer, the first hard mask patterns 202B may include an oxide layer, and the second hard mask patterns 202C may include a nitride layer.

Subsequently, a dielectric layer, for example, an oxide layer, is formed to cover the entire resultant structure including the trenches. Next, a planarization process, for example, CMP, is performed to expose the second hard mask patterns 202C, and a first isolation layer 210A is formed to be disposed in the isolation regions with the narrow gap.

Figure 6B:
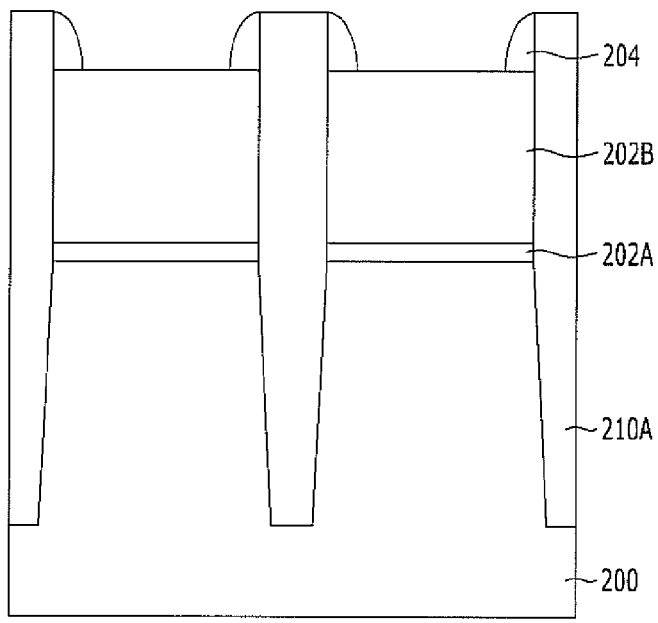

Referring to FIG. 6B, after removing the second hard mask patterns 202C, a dielectric layer, for example, a nitride layer, is deposited on the entire surface of the resultant structure, and a blanket etch is performed to form spacers 204 on portions of both sidewalls of the first isolation layer 210A that project out of the first hard mask patterns 202B.

Figure 6C:
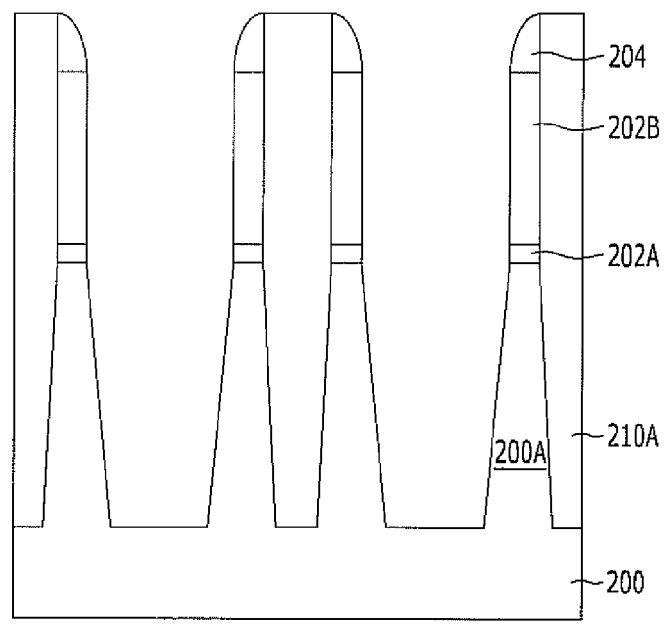

Referring to FIG. 6C, trenches are formed to define isolation regions with a wide gap among the isolation regions by etching the first hard mask patterns 202B, the first tunnel dielectric layer 202A and the substrate 200 using the spacers 204 and the portions of the first isolation layer 210A as an etch mask.

As a result of this process, active regions 200A are formed and defined by the isolation regions with the narrow gap and the isolation regions with the wide gap.

Figure 6D:
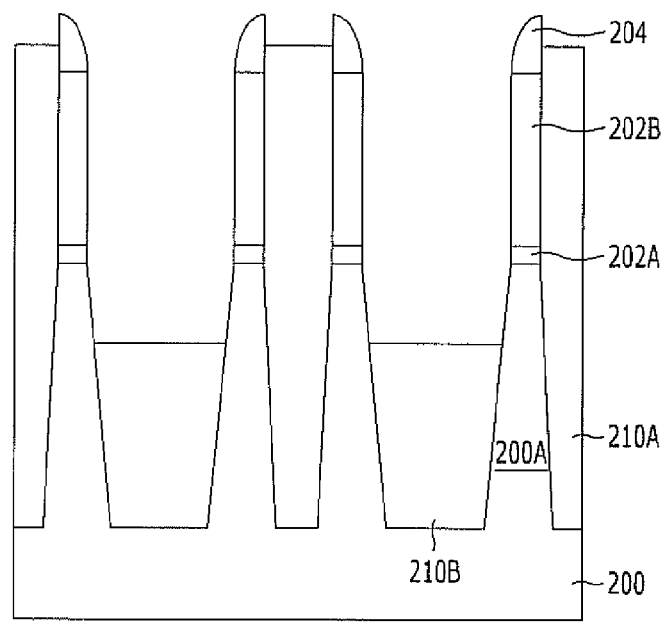

Referring to FIG. 6D, after forming a dielectric layer, for example, an oxide layer, to cover the resultant structure of FIG. 6C including the isolation regions with a wide gap, a polishing process such as CMP or an etch-back process is performed for the dielectric layer such that the height of the dielectric layer filled in the isolation regions with the wide gap is lower than the height of the active regions 200A by a designated level. At this time, the first isolation layer 210A, which is disposed in the isolation regions with the narrow gap, is not substantially removed and remain in the isolation region with a narrow gap. is the isolation layer 210A remains because a polishing speed or an etching speed in a narrow space is lower than a polishing speed or an etching speed in a wide space.

As a result of this process, a second isolation layer 210B, which is disposed in the isolation regions with the wide gap and has a height lower than that of the active regions 200A, is formed. By forming the second isolation layer 210B, first sidewalls of the active regions 200A vertically extend upward out of the second isolation layer 210B.

Figure 6E:
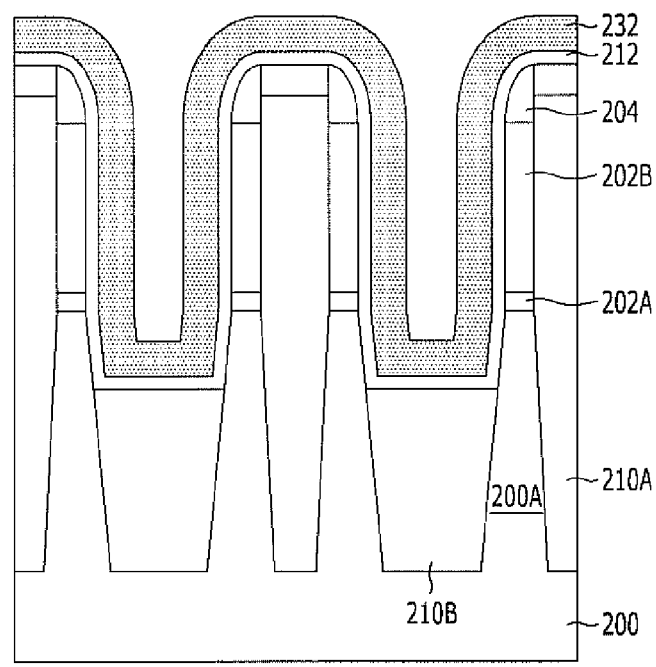

Referring to FIG. 6E, a second tunnel dielectric layer 212 and a conductive layer 232 for floating gates are formed on the entire surface of the resultant structure including the second isolation layer 210B. The second tunnel dielectric layer 212 is disposed at least on the first sidewalls of the active regions 200A that are exposed.

Figure 6F:
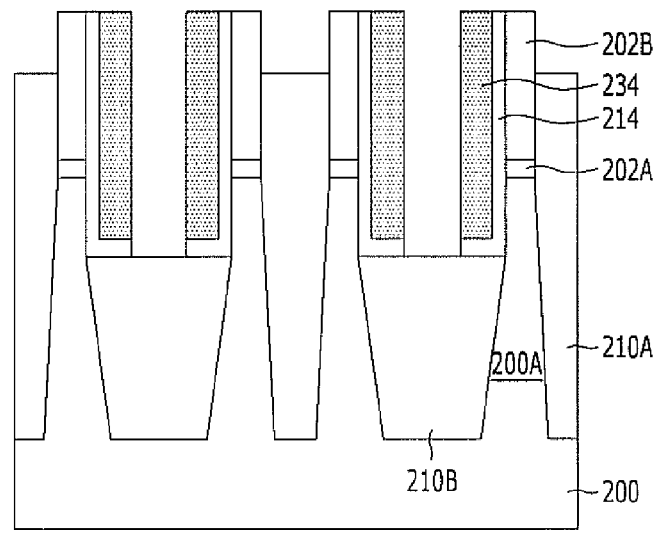

Referring to FIG. 6F, by performing blanket etching for the conductive layer 232 for floating gates and the second tunnel dielectric layer 212, a conductive layer 234 for floating gates, which is divided in the second direction for the respective active regions 200A, and a second tunnel dielectric layer 214, which is etched and disposed under the conductive layer 234 for floating gates, are formed.

As a result of this process, the conductive layer 234 for floating gates is disposed on the second isolation layer 210B with the second tunnel dielectric layer 214 interposed between the second conductive layer 234 and the second isolation layer 210B, and adjoins the first sidewalls of the active regions 200A and the sidewalls of the first tunnel dielectric layer 202A and the first hard mask patterns 202B.

Next, the spacers 204 are removed.

Figure 6G:
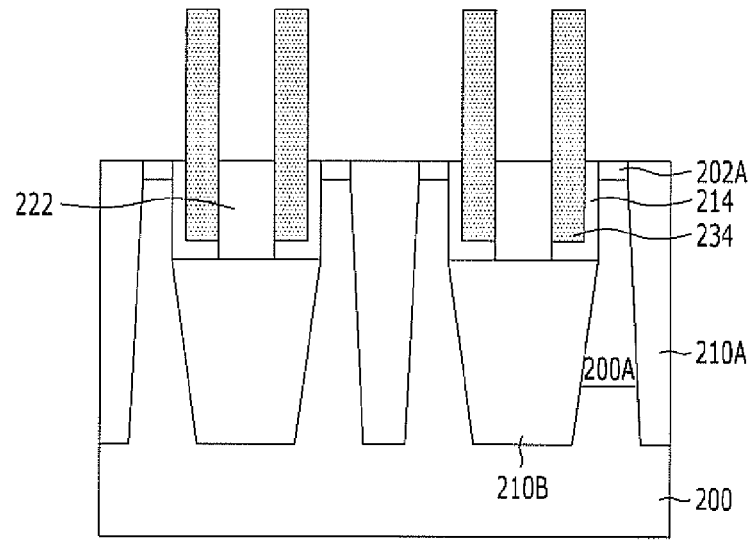

Referring to FIG. 6G, after forming a dielectric layer, for example, an oxide layer, to cover the resultant structure of FIG. 6F, a polishing or etch-back process is performed for the dielectric layer so that the conductive layer 234 for floating gates extend out of the active regions 200A by a designated height. The polished or etched dielectric layer is designated by the reference numeral 222. At this time, since the first isolation layer 210A and the first hard mask patterns 202B may include oxide layers, they are polished or etched together. Accordingly, as a result of this process, the entire surface excluding the conductive layer 234 for floating gates is planarized. The reference numerals 222 and 202A may correspond to the reference numeral 260 of FIG. 5A.

Figure 6H:
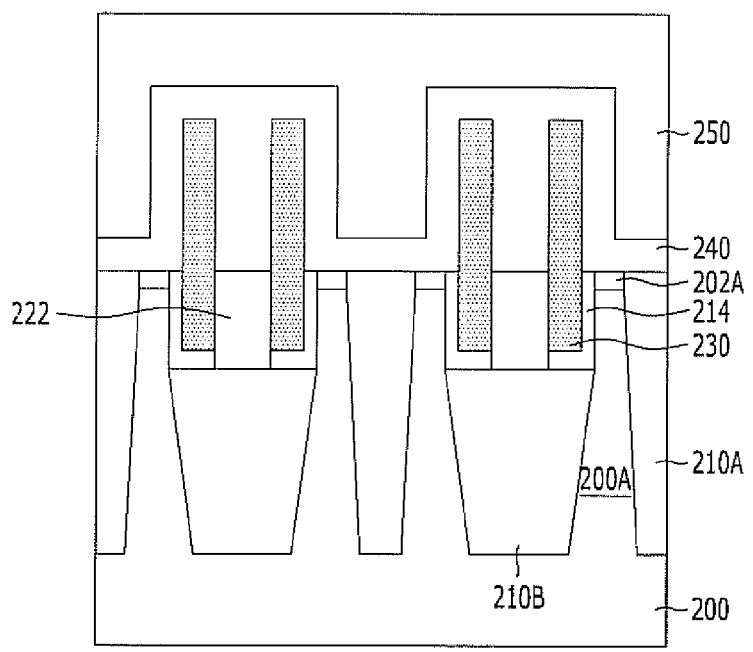

Referring to FIG. 6H, after an intergate dielectric layer 240 is formed along the profile of the resultant structure including the conductive layer 234 for floating gates, and a conductive layer for control gates is formed on the intergate dielectric layer 240. The conductive layer for control gates, the intergate dielectric layer 240, and the conductive layer 234 for floating gates are patterned to form control gates 250, which extend in the second direction, the intergate dielectric layer 240, which is disposed under the control gates 250 and extends in the second direction, and floating gates 230, which are disposed below the control gates 250 for the respective active regions 200A.

FIGS. 7A to 7G are cross-sectional views illustrating another embodiment of a method for fabricating the nonvolatile memory device in accordance with the second embodiment of the present invention. These cross-sectional views illustrate cross-sections taken along the line A-A' of FIG. 5B. These cross-sectional views may be used to describe a method for fabricating a nonvolatile memory device in accordance with the variation of the second embodiment or another variation of the second embodiment.

Figure 7A:
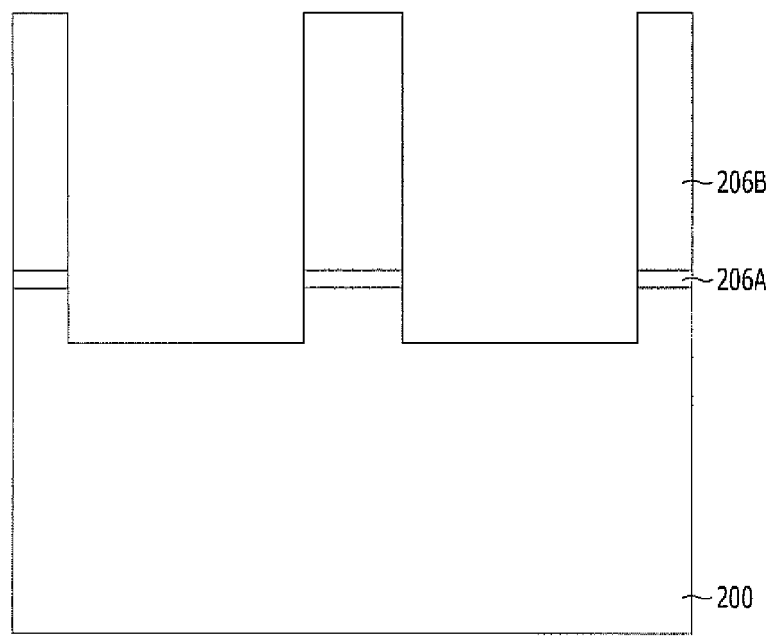
FIGS. 7A to 7G are cross-sectional views illustrating another embodiment of a method for fabricating the nonvolatile memory device in accordance with the second embodiment of the present invention.

Referring to FIG. 7A, after forming a stack structure including a first tunnel dielectric layer 206A, and first hard mask patterns 206B on a substrate 200, the substrate 200 is etched to a designated depth using the stack structure as an etch mask. The stack structure is formed to cover isolation regions with a narrow gap and both side portions thereof and not to cover isolation regions with a wide gap and both side portions thereof.

The first tunnel dielectric layer 206A may include an oxide layer, and the first hard mask patterns 206B may include an oxide layer.

Figure 7B:
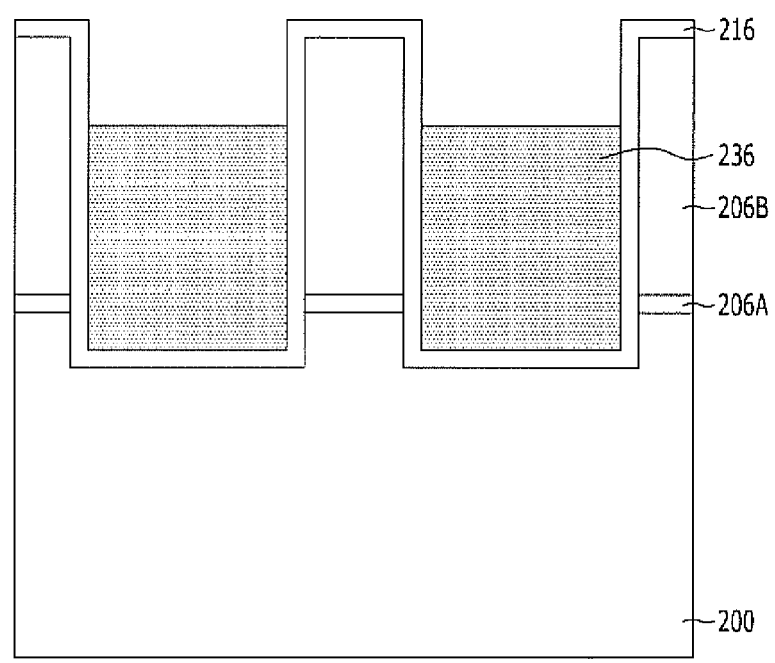

Referring to FIG. 7B, a second tunnel dielectric layer 216 is formed along the entire surface of the underlying profile of the resultant structure of FIG. 7A. The second tunnel dielectric layer 216 may be formed through a deposition process or an oxidation process.

Subsequently, a conductive layer 236 for floating gates is formed on the second tunnel dielectric layer 216. The conductive layer 236 for floating gates is formed to have a height lower than the surface of the first hard mask patterns 206B. The conductive layer 236 for floating gates may be formed by depositing a conductive layer on the resultant structure formed with the second tunnel dielectric layer 216 and performing etch-back for the conductive layer so that the height of the conductive layer is lower than the surface of the first hard mask patterns 206B.

Figure 7C:
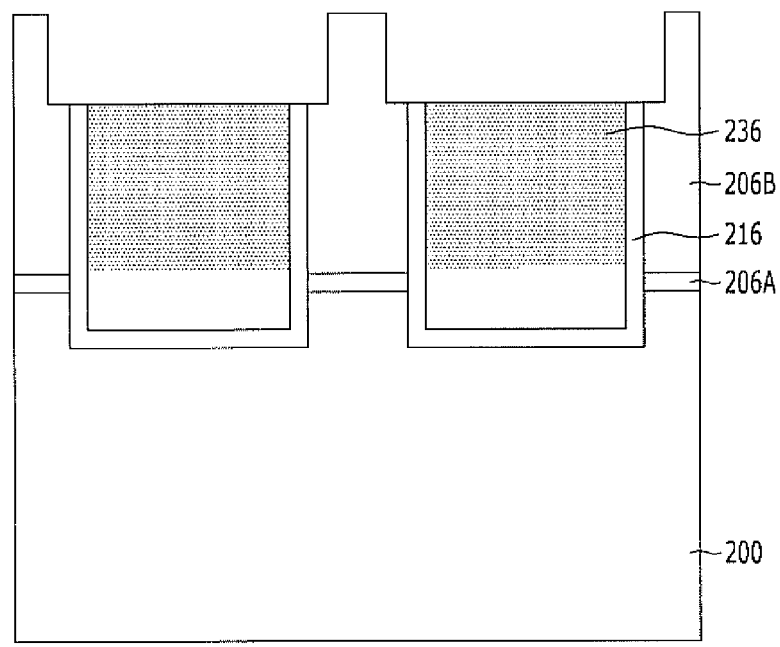

Referring to FIG. 7C, by removing the second tunnel dielectric layer 216 that extend out of the conductive layer 236 for floating gates and removing portions of the first hard mask patterns 206B that are exposed due to removal of the second tunnel dielectric layer 216, the width of the first hard mask patterns 206B in a second direction is decreased. This process may be performed, for example, through a wet etching process for an oxide layer.

Figure 7D:
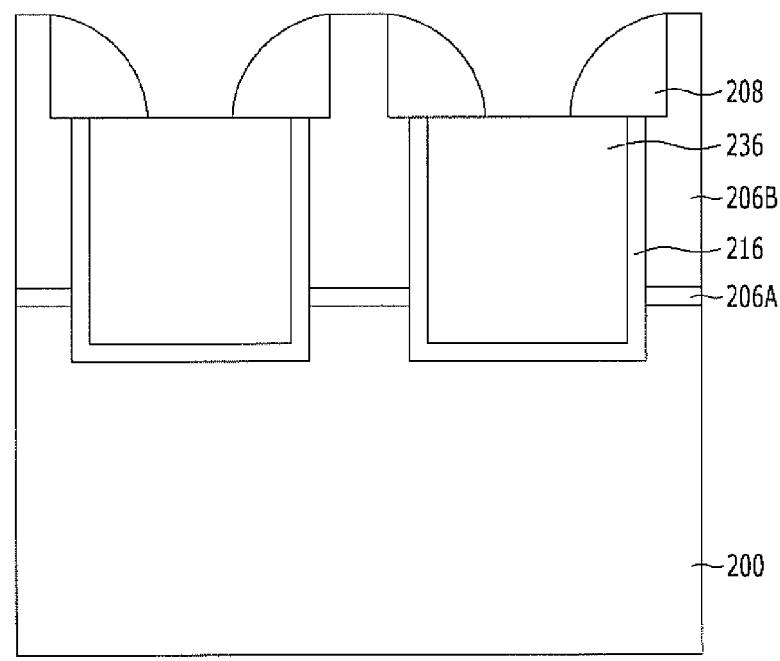

Referring to FIG. 7D, by depositing a dielectric layer, for example, a nitride layer, on the entire surface of the resultant structure of FIG. 7C and performing blanket etching, spacers 208 are formed on both sidewalls of the first hard mask patterns 206B that project out of the conductive layer 236 for floating gates. Hereinafter, the spacers 208 will be referred to as a pair of spacers 208.

Figure 7E:
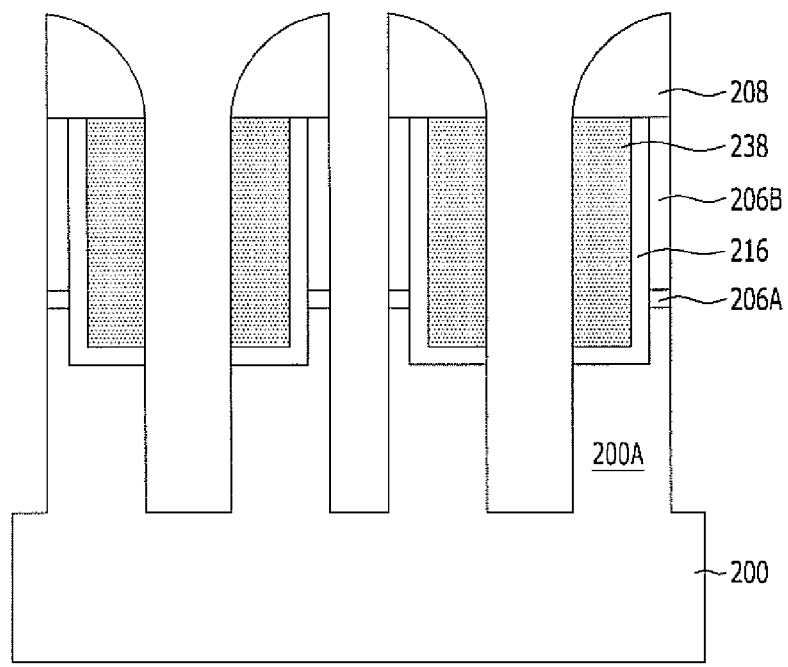

Referring to FIG. 7E, the conductive layer 236 for floating gates, the second tunnel dielectric layer 216 and the substrate 200 are etched to a designated depth on both sides of the pair of spacers 208 to form trenches are formed in the isolation regions with the wide gap, and the first hard mask patterns 206B, the first tunnel dielectric layer 206A and the substrate 200 are etched to the designated depth between the pair of spacers 208 to form trenches are formed in the isolation regions with the narrow gap.

As a result of this etching process, regions 200A are formed, which are defined by the isolation regions with the narrow gap, and the isolation regions with the wide gap, and a conductive layer 238 for floating gates are formed, which is divided in the second direction for the respective active regions 200A.

Next, while not shown in the drawing, the spacers 208 are removed.

Figure 7F:
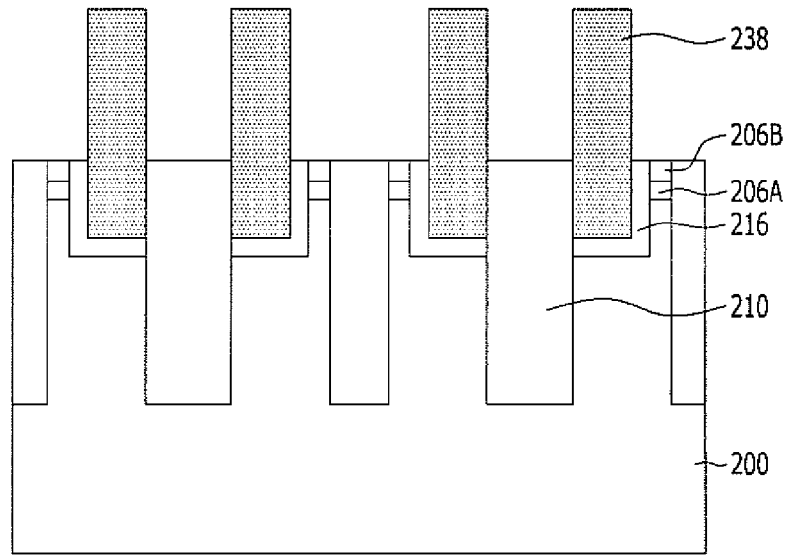

Referring to FIG. 7F, after forming a dielectric layer, for example, an oxide layer, to cover the resultant structure of FIG. 7E, a polishing or etch-back process is performed for the dielectric layer such that the conductive layer 238 for floating gates vertically extend upward out of the active regions 200A by a designated height. The polished or etched dielectric layer is filled in the trenches that are defined in the isolation regions with the narrow gap and the isolation regions with the wide gap, and thus, an isolation layer 210 is formed.

In this process for forming the isolation layer 210, since the first hard mask patterns 206B and the second tunnel dielectric layer 216 may include oxide layers, they are polished or etched together. Accordingly, as a result of this process, the entire surface excluding the conductive layer 238 for floating gates is planarized.

Figure 7G:
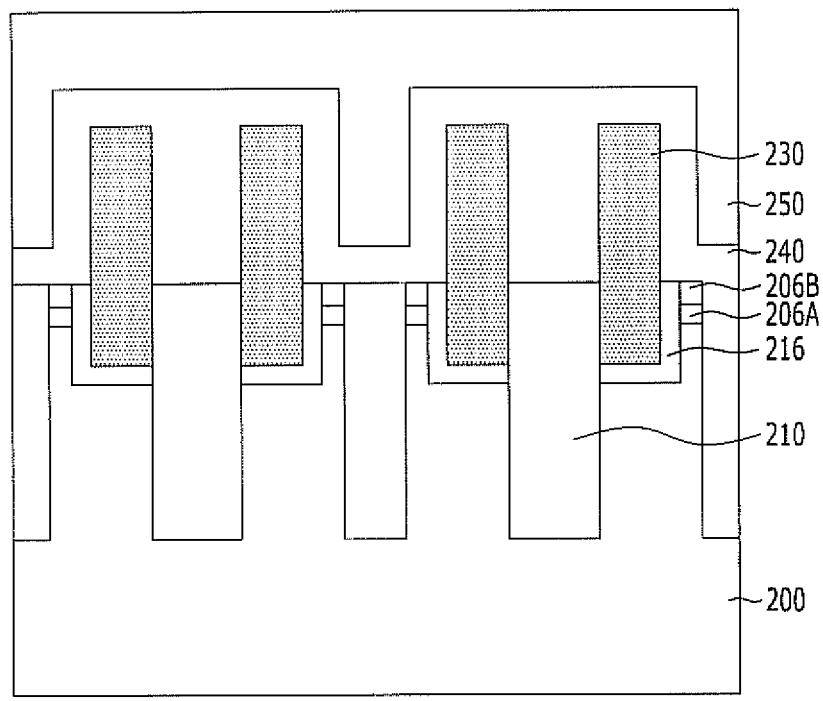

Referring to FIG. 7G, an intergate dielectric layer 240 is formed along the profile of the resultant structure including the conductive layer 238 for floating gates, and a conductive layer for control gates is formed on the intergate dielectric layer 240. The conductive layer for control gates, the intergate dielectric layer 240 and the conductive layer 238 for floating gates are patterned to form control gates 250, which extend in the second direction, the intergate dielectric layer 240, which is disposed under the control gates 250 and extends in the second direction, and floating gates 230, which are disposed below the control gates 250 divided in the second direction for the respective active regions 200A.

Figure 8A:
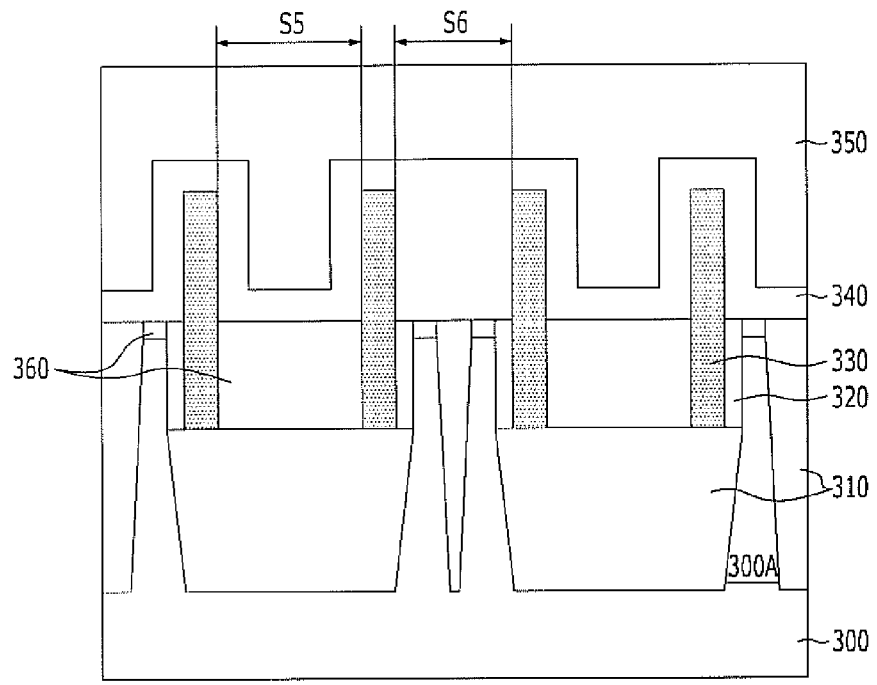
FIG. 8A is a cross-sectional view illustrating a nonvolatile memory device in accordance with a third embodiment of the present invention.
Figure 8B:
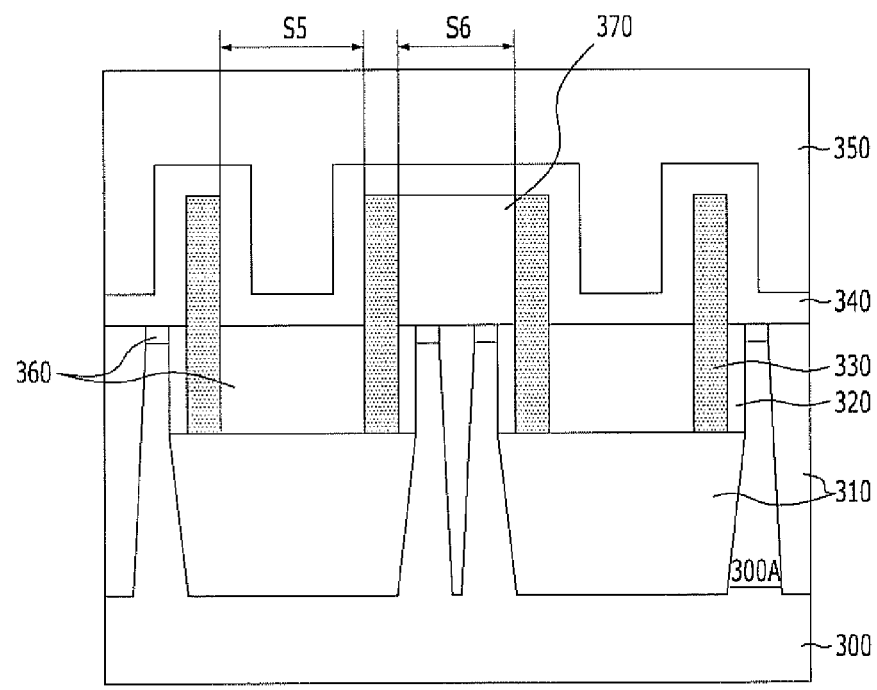
FIG. 8B is a cross-sectional view illustrating a nonvolatile memory device in accordance with a variation of the third embodiment of the present invention.

FIG. 8A is a cross-sectional view illustrating a nonvolatile memory device in accordance with a third embodiment of the present invention, and FIG. 8B is a cross-sectional view illustrating a nonvolatile memory device in accordance with a variation of the third embodiment of the present invention. When comparing the nonvolatile memory device in accordance with the third embodiment with that of the second embodiment, the nonvolatile memory device in accordance with the third embodiment is similar the second embodiment except that gaps between floating gates are changed and accordingly, sidewalls of floating gates adjoining control gates are changed. The differences with respect to the second embodiment will be mainly described.

Referring to FIG. 8A, the sidewalls of floating gates 330 that do not adjoin active regions 300A are referred to as first sidewalls and the sidewalls of the floating gates 330 that adjoin the active regions 300A are referred to as second sidewalls as aforementioned above. Unlike the second embodiment, a space S5 between the first sidewall of a floating gate 330 and the first sidewall of another adjacent floating gate 330 has a relatively wide gap, and a space S6 between the second sidewall of a floating gate 330 and the second sidewall of another adjacent floating gate 330 has a relatively narrow gap. Accordingly, an intergate dielectric layer 340 and a control gate 350 are formed in the space S5 between the first sidewalls of the floating gates 330. Conversely, since the space S6 between the second sidewalls of the floating gates 330 is relatively narrow, the space S6 may be completely filled with the intergate dielectric layer 340. A dielectric layer 360 may include, for example, an oxide layer.

Referring to FIG. 8B, the structure shown in FIG. 8B is substantially the same as the structure shown in FIG. 8A and is differentiated from the structure shown in FIG. 8A in that a specified dielectric layer 370, for example, an oxide layer, is filled in the space S6 between the second sidewalls of the floating gates 330 such that the intergate dielectric layer 340 is not positioned close to the active regions 300A. If the intergate dielectric layer 340 is not positioned close to the active regions 300A, the occurrence of leakage current between control gates 350 and the active regions 300A may be prevented.

Figure 9:
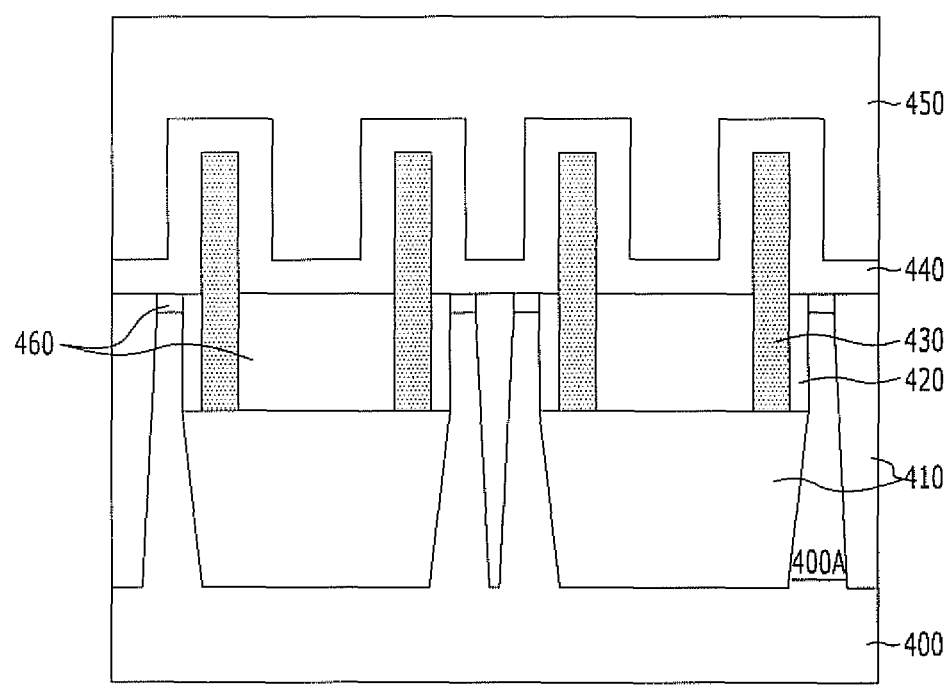
FIG. 9 is a cross-sectional view illustrating a nonvolatile memory device in accordance with a fourth embodiment of the present invention.

FIG. 9 is a cross-sectional view illustrating a nonvolatile memory device in accordance with a fourth embodiment of the present invention. When comparing the nonvolatile memory device in accordance with the fourth embodiment with the second or third embodiment, the nonvolatile memory device in accordance with the fourth embodiment is similar to that of the second or third embodiment except that gaps between floating gates are widened and accordingly, both sidewalls of floating gates adjoin control gates. The differences with respect to the second or third embodiment will be mainly described.

Referring to FIG. 9, the sidewalls of floating gates 430 that do not adjoin active regions 400A are referred to as first sidewalls, and the sidewalls of the floating gates 430 that adjoin the active regions 400A are referred to as second sidewalls as aforementioned above. Unlike the second embodiment or the third embodiment, both the space between the first sidewall of a floating gate 430 and the first sidewall of another adjacent floating gate 430, and the space between the second sidewall of a floating gate 430 and the second sidewall of another adjacent floating gate 430 have relatively wide gaps. Accordingly, both the space between the first sidewalls of the floating gates 430 and the space between the second sidewalls of the floating gates 430 may be filled with an intergate dielectric layer 440 and control gates 450. A dielectric layer 460 may include, for example, an oxide layer.

Figure 10:
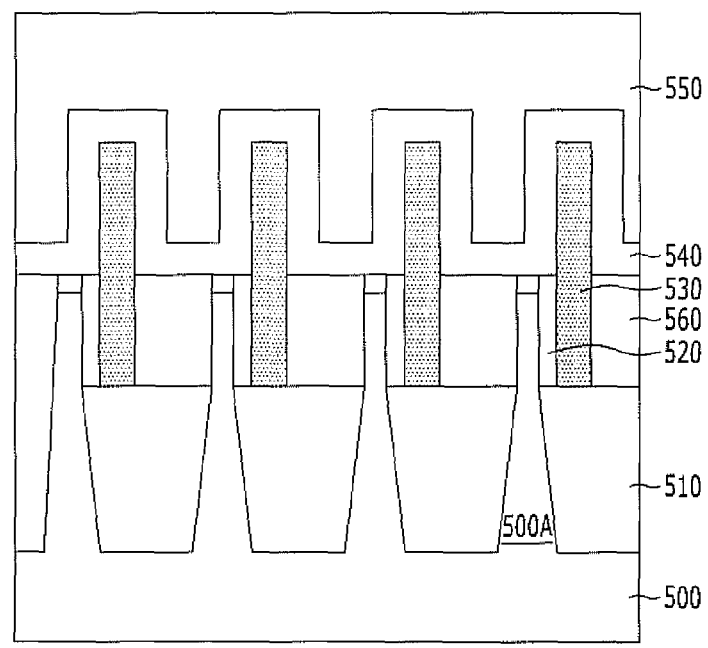
FIG. 10 is a cross-sectional view illustrating a nonvolatile memory device in accordance with a fifth embodiment of the present invention.

FIG. 10 is a cross-sectional view illustrating a nonvolatile memory device in accordance with a fifth embodiment of the present invention. When comparing the nonvolatile memory device in accordance with the fifth embodiment with the second to fourth embodiments, the nonvolatile memory device in accordance with the fifth embodiment is differentiated from the second to fourth embodiments in that a gap between active regions is constant and accordingly, a gap between floating gates is constant. The differences with respect to any one of the second to fourth embodiments will be concretely described with reference to FIG. 10.

Referring to FIG. 10, the gaps between active regions 500A, which are defined by an isolation layer 510, more specifically, the widths of isolation regions are constant. As aforementioned above, at least first sidewalls of the active regions 500A that adjoin floating gates 530 extend vertically upward out of the isolation layer 510.

The floating gates 530 adjoin the first sidewalls of the active regions 500A with a tunnel dielectric layer 520 interposed between the active regions 500A and the floating gates 530 and extend out of a substrate 500. The sidewalls of the floating gates 530 that do not adjoin the active regions 500A are referred to as first sidewalls, and the sidewalls of the floating gates 530 that adjoin the active regions 500A are referred to as second sidewalls as aforementioned above. The first sidewalls of the floating gates 530 are arranged in one direction such that they do not face one another, and the second sidewalls of the floating gates 530 are arranged in the other direction such that they also do not face one another. Thus, the present embodiment is differentiated from the second to fourth embodiments described above, where the first sidewalls of floating gates face one another and the second sidewalls of the floating gates face one another.

Due to the arrangements and shapes of the active regions 500A and the floating gates 530 as described above, the gaps between the floating gates 530 are constant.

An intergate dielectric layer 540 and control gates 550 are sequentially formed on the floating gates 530 to fill the spaces between the first sidewalls and the second sidewalls of the floating gates 530.

A dielectric layer 560 may include, for example, an oxide layer.

Figure 11:
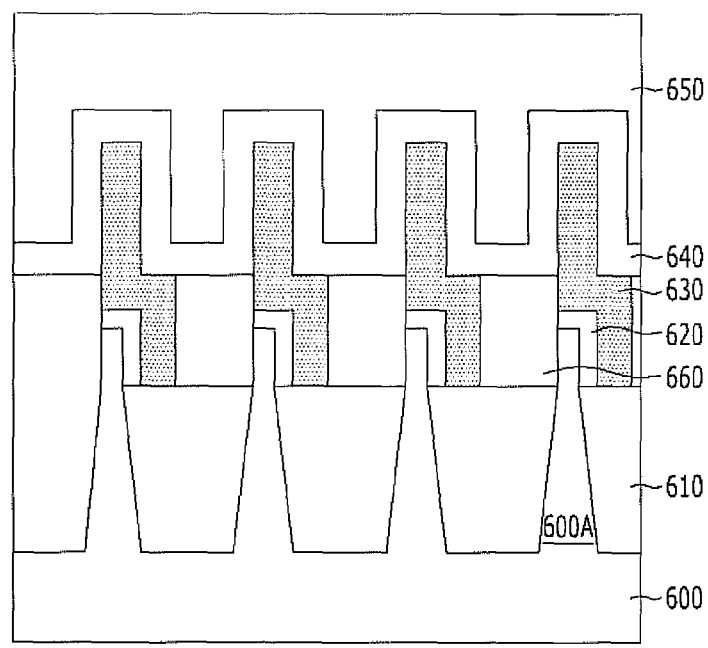
FIG. 11 is a cross-sectional view illustrating a nonvolatile memory device in accordance with a sixth embodiment of the present invention.

FIG. 11 is a cross-sectional view illustrating a nonvolatile memory device in accordance with a sixth embodiment of the present invention. When comparing the nonvolatile memory device in accordance with the sixth embodiment with the first embodiment, the nonvolatile memory device in accordance with the sixth embodiment is differentiated from the first embodiment in that gaps between active regions are constant and accordingly, gaps between floating gates are constant. The differences with respect to the first embodiment will be concretely described with reference to FIG. 11.

Referring to FIG. 11, the gaps between active regions 600A, which are defined by an isolation layer 610, more specifically, the widths of isolation regions are constant. As aforementioned above, at least first sidewalls of the active regions 600A that adjoin floating gates 630, extend vertically upward out of the isolation layer 610.

The floating gates 630 adjoin the first sidewalls and the upper surfaces of the active regions 600A with a tunnel dielectric layer 620 interposed between the active regions 600A and the floating gates 630 and extend from a substrate 600. The sidewalls of the floating gates 630 that do not adjoin the active regions 600A are referred to as first sidewalls, and the sidewalls of the floating gates 630 that adjoin the active regions 600A are referred to as second sidewalls as aforementioned above. The first sidewalls of the floating gates 630 are arranged in one direction such that they do not face one another, and the second sidewalls of the floating gates 630 are arranged in the other direction such that they also do not face one another. Thus, the present embodiment is differentiated from the first embodiment described above, where the first sidewalls of floating gates face one another and the second sidewalls of the floating gates face one another.

Due to the arrangements and shapes of the active regions 600A and the floating gates 630 as described above, the gaps between the floating gates 630 are constant.

An intergate dielectric layer 640 and control gates 650 are sequentially formed on the floating gates 530 to fill the spaces between the first sidewalls and the second sidewalls of the floating gates 630.

A dielectric layer 660 may include, for example, an oxide layer.

Various embodiments of the present invention have been described above. By forming floating gates to adjoin the sidewalls of active regions, a channel length of a memory cell may be secured.

Further, in at least some of the embodiments of the present invention, only first sidewalls of floating gates may be formed to adjoin control gates, and accordingly, a space for forming a control gate between floating gates may be sufficiently secured. However, the present invention is not limited to such. In the embodiments of the present invention, if the space for forming a control gate between floating gates is sufficiently secured because the line width of the floating gates is small, etc., both sidewalls of floating gates may be formed to adjoin control gates.

As is apparent from the above descriptions, in the nonvolatile memory device and the method for fabricating the same in accordance with the embodiments of the present invention, the channel length of a memory cell can be secured without increasing the in width of a floating gate, and a space between floating gates can be secured.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
   a substrate having active regions that are defined by an isolation layer and that have first sidewalls and second sidewalls which are opposite to the first sidewalls, wherein portions of the first sidewalls of the active regions towers above the isolation layer;
   floating gates having first portions facing the portions of the first sidewalls of the active regions and second portions towering above the active regions, wherein the floating gates do not face the second sidewalls of the active regions;
   a tunnel dielectric layer interposed between the active regions and the floating gates;
   an intergate dielectric layer disposed over the floating gates; and
   a control gate disposed over the intergate dielectric layer.

2. The nonvolatile memory device of claim 1, wherein the control gate faces first sidewalls of the second portions of the floating gates, and the control gate does not face second sidewalls of the second portions of the floating gates.

3. The nonvolatile memory device of claim 2,
   wherein first and second spaces are alternately and repeatedly defined between the second portions of the floating gates, the first spaces being narrower than the second spaces, and
   wherein the first sidewalls of the floating gates face the second spaces.

4. The nonvolatile memory device of claim 3,
   wherein the second sidewalls of the floating gates face the first spaces, and
   wherein the first spaces are filled with the intergate dielectric layer.

5. The nonvolatile memory device of claim 3,
   wherein the second sidewalls of the floating gates face the first spaces,
   wherein the first spaces are filled with a dielectric layer, and
   wherein the intergate dielectric layer is disposed over the dielectric layer.

6. The nonvolatile memory device of claim 1, wherein the floating gates have bent portions so that the second portions of the floating gates face upper surfaces of the active regions.

7. The nonvolatile memory device of claim 1, wherein the floating gates have a rectangular shape so that the second portions of the floating gates do not face upper surfaces of the active regions.

8. The nonvolatile memory device of claim 1,
   wherein first isolation regions and second isolation regions are alternately and repeatedly defined between the active regions, the first isolation regions being narrower than the second isolation regions, and
   wherein the first sidewalls of the active regions face the second isolation regions.

9. The nonvolatile memory device of claim 1, wherein the control gate faces first sidewalls and second sidewalls of the second portions of the floating gates.

10. The nonvolatile memory device of claim 1,
wherein isolation regions of the same width are defined between the active regions, and
wherein the first sidewalls of the active regions face the same direction.

\* \* \* \* \*